(12) United States Patent
Imai et al.

(10) Patent No.: US 11,721,704 B2
(45) Date of Patent: Aug. 8, 2023

(54) ACTIVE MATRIX SUBSTRATE

(71) Applicant: Sharp Kabushiki Kaisha, Sakai (JP)

(72) Inventors: Hajime Imai, Sakai (JP); Tohru Daitoh, Sakai (JP); Tetsuo Kikuchi, Sakai (JP); Masamitsu Yamanaka, Sakai (JP); Yoshihito Hara, Sakai (JP); Tatsuya Kawasaki, Sakai (JP); Masahiko Suzuki, Sakai (JP); Setsuji Nishimiya, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/665,750

(22) Filed: Feb. 7, 2022

(65) Prior Publication Data

US 2022/0157855 A1    May 19, 2022

Related U.S. Application Data

(63) Continuation of application No. 16/830,313, filed on Mar. 26, 2020, now Pat. No. 11,296,126.

(30) Foreign Application Priority Data

Mar. 29, 2019 (JP) .................................. 2019-068403

(51) Int. Cl.
*H01L 27/12* (2006.01)
*H01L 29/24* (2006.01)
(Continued)

(52) U.S. Cl.
CPC .......... *H01L 27/124* (2013.01); *G02F 1/1368* (2013.01); *G02F 1/134363* (2013.01);
(Continued)

(58) Field of Classification Search
CPC .............. H01L 29/24; H01L 29/66969; H01L 29/78633; H01L 21/02565;
(Continued)

(56) References Cited

U.S. PATENT DOCUMENTS

2012/0241750 A1* 9/2012 Chikama ............. H01L 27/1248
438/151
2013/0153904 A1* 6/2013 Nishimura .............. H01L 21/82
438/155
(Continued)

OTHER PUBLICATIONS

Imai et al., "Active Matrix Substrate and Manufacturing Method Thereof", U.S. Appl. No. 16/830,313, filed Mar. 26, 2020.

*Primary Examiner* — Mouloucoulaye Inoussa
(74) *Attorney, Agent, or Firm* — Keating & Bennett, LLP

(57) ABSTRACT

The oxide semiconductor layer is electrically connected to a source electrode or the source bus line within the source opening formed in the lower insulating layer, each wiring line connection section includes a lower conductive portion formed using the first conductive film, the lower insulating layer extending over the lower conductive portion, an oxide connection layer formed using an oxide film the same as the oxide semiconductor layer and electrically connected to the lower conductive portion within the lower opening formed in the lower insulating layer, an insulating layer covering the oxide connection layer, and an upper conductive portion electrically connected to the oxide connection layer within the upper opening formed in the insulating layer, wherein the oxide connection layer includes a region lower in a specific resistance than the channel region of the oxide semiconductor layer.

10 Claims, 37 Drawing Sheets

(51) Int. Cl.

| | |
|---|---|
| *H01L 29/417* | (2006.01) |
| *H01L 29/786* | (2006.01) |
| *H01L 21/02* | (2006.01) |
| *H01L 21/465* | (2006.01) |
| *H01L 29/66* | (2006.01) |
| *G02F 1/1368* | (2006.01) |
| *G02F 1/1362* | (2006.01) |
| *G02F 1/1343* | (2006.01) |

(52) U.S. Cl.
CPC .. *G02F 1/136286* (2013.01); *H01L 21/02565* (2013.01); *H01L 21/02631* (2013.01); *H01L 21/465* (2013.01); *H01L 27/127* (2013.01); *H01L 27/1225* (2013.01); *H01L 29/24* (2013.01); *H01L 29/41733* (2013.01); *H01L 29/66969* (2013.01); *H01L 29/7869* (2013.01); *H01L 29/78633* (2013.01); *G02F 1/134372* (2021.01); *G02F 2201/123* (2013.01)

(58) Field of Classification Search
CPC ......... H01L 21/30604; H01L 29/41733; H01L 29/7869; H01L 21/465; H01L 21/02631; H01L 27/127; H01L 27/124; H01L 27/1225; H01L 27/1218; H01L 23/66; H01L 27/1288; H01L 29/78618; H01L 27/66969; H01L 21/02609; H01L 27/1259; H01L 29/45; H01L 21/441; H01L 29/78606; H01L 23/53223; G02F 1/1368; G02F 1/136286; G02F 1/134363; G02F 1/13685; G02F 1/136209; G02F 1/134372; G02F 1/133707; H01Q 1/2283; H01Q 13/103; H01Q 3/443; H01Q 21/064
USPC .................. 257/72, 43, 71, 57, E21.158, 25, 257/E33.053; 438/38, 104, 151, 155; 349/43
See application file for complete search history.

(56) References Cited

U.S. PATENT DOCUMENTS

| | | | | |
|---|---|---|---|---|
| 2014/0347590 | A1* | 11/2014 | Fujita | ................... H01L 27/127 257/43 |
| 2015/0311232 | A1* | 10/2015 | Sun | ................... G02F 1/136286 257/72 |
| 2017/0090229 | A1* | 3/2017 | Imai | ................... H01L 29/78633 |
| 2017/0345940 | A1* | 11/2017 | Suzuki | ............... H01L 29/7869 |
| 2021/0249445 | A1* | 8/2021 | Suzuki | ............. H01L 29/78633 |

* cited by examiner

ACTIVE MATRIX SUBSTRATE

CROSS-REFERENCE TO RELATED APPLICATIONS

This application claims the benefit of priority to Japanese Patent Application Number 2019-068403 filed on Mar. 29, 2019. The entire contents of the above-identified application are hereby incorporated by reference.

BACKGROUND

Technical Field

The disclosure relates to an active matrix substrate and a manufacturing method thereof.

A display device has been is widely used that includes an active matrix substrate provided with switching elements for respective pixels. An active matrix substrate provided with thin film transistors (hereinafter referred to as a "TFT") as the switching elements is referred to as a TFT substrate. Note that, a portion of the TFT substrate corresponding to a pixel of the display device is referred to herein as a pixel area or a pixel. The TFT provided as a switching element to each pixel of the active matrix substrate is referred to as a "pixel TFT".

The TFT substrate is provided with a plurality of source bus lines and a plurality of gate bus lines, and a pixel TFT is disposed in the vicinity of each of intersections of these lines. A source electrode of the pixel TFT is connected to one of the source bus lines, and a gate electrode is connected to one of the gate bus lines. Thus, typically, the source electrode is formed in the same metal layer (source metal layer) as the source bus line, and the gate electrode is formed in the same metal layer (gate metal layer) as the gate bus line.

The TFT substrate is provided with a wiring line connection section for connecting (or changing connection of) a wiring line formed in the source metal layer or the gate metal layer to another wiring line. The wiring line connection section includes, for example, a terminal section, a source-gate connection section that connects the source metal layer and the gate metal layer, and the like.

In recent years, there is proposed use of an oxide semiconductor as a material of an active layer of the TFT, in place of amorphous silicon and polycrystalline silicon. Such a TFT is referred to as an "oxide semiconductor TFT." The oxide semiconductor has mobility higher than mobility of amorphous silicon. Thus, the oxide semiconductor TFT can act at a higher speed than an amorphous silicon TFT. In addition, since an oxide semiconductor film is formed by a process simpler than that of a polycrystalline silicon film, the oxide semiconductor film can be applied to a device that requires a large area.

Although many oxide semiconductor TFTs have a bottom gate structure, an oxide semiconductor TFT having a top gate structure is also proposed. For example, JP 2015-109315 A discloses a top gate structure TFT in which a gate electrode is disposed on a portion of an oxide semiconductor layer with a gate insulating layer interposed therebetween, and source and drain electrodes disposed on an insulating layer covering the gate electrode. The top gate structure TFT has an advantage that parasitic capacitances formed at the intersections of the gate electrode and the source and drain electrodes can be reduced compared to the bottom gate structure TFT.

SUMMARY

However, in a case where the top gate structure TFT described in JP 2015-109315 A is used as the pixel TFT, for example, the parasitic capacitances formed at the intersections of the gate bus line and the source bus line possibly increase to increase a load on the source bus line.

On the other hand, WO 2015/186619, the application being filed by the present applicant, proposes a substrate structure in which a source electrode and a source bus line are provided closer to a substrate than an oxide semiconductor layer of a top gate structure TFT (hereinafter, referred to as a "bottom source structure").

According to study by the present inventors, in an TFT substrate having a bottom source structure (hereinafter abbreviated as a "bottom source structure substrate"), an insulating layer disposed between the source bus line and the gate bus line can be made thicker, so it is possible to reduce the parasitic capacitances generated at the intersections of these bus lines.

The WO 2015/186619 does not disclose a structure of a wiring line connection section such as a terminal section formed on a bottom source structure substrate.

According to study by the present inventors, in a process for manufacturing a bottom source structure substrate, in a case where a source metal layer is used to form a wiring line connection section, damage may be imparted to the source metal layer or the oxide semiconductor layer. Therefore, it may be difficult to form a wiring line connection section or an oxide semiconductor TFT having desired characteristics on the bottom source structure substrate. Details will be described below.

An embodiment of the disclosure provides an active matrix substrate including an oxide semiconductor TFT and a wiring line connection section, and capable of reducing a parasitic capacitance.

An active matrix substrate and a manufacturing method of an active matrix substrate are disclosed herein in the following items.

Item 1

An active matrix substrate including:

a display area including a plurality of pixel areas and a non-display region other than the display area;

a substrate;

a plurality of source bus lines supported by the substrate and formed using a first conductive film;

a lower insulating layer covering the plurality of source bus lines;

an oxide semiconductor TFT disposed in each of the plurality of pixel areas, the oxide semiconductor TFT including an oxide semiconductor layer disposed on the lower insulating layer and a gate electrode disposed on a portion of the oxide semiconductor layer with a gate insulating layer interposed between the oxide semiconductor layer and gate electrode;

a pixel electrode disposed in each of the plurality of pixel areas;

a plurality of gate bus lines formed using a second conductive film the same as the gate electrode; and a plurality of wiring line connection sections supported by the substrate, the plurality of wiring line connection sections including a plurality of terminal sections disposed in the non-display region, wherein the oxide semiconductor layer of the oxide semiconductor TFT includes a channel region, and first and second regions located on both sides of the channel region and lower in a specific resistance than the channel region, the gate electrode is electrically connected to one of the plurality of gate bus lines, the oxide semiconductor layer is disposed on the lower insulating layer and within a source opening formed in the lower insulating layer, the first region of the oxide semiconductor layer is electrically connected to a source electrode formed using the first conductive film or one of the plurality of source bus lines within the source opening, the second region is electrically connected to the pixel electrode, each of the plurality of wiring line connection sections includes a lower conductive portion formed using the first conductive film, the lower insulating layer extending over the lower conductive portion, the lower insulating layer including a lower opening exposing a portion of the lower conductive portion, an oxide connection layer formed using an oxide film the same as the oxide semiconductor layer and disposed separate from the oxide semiconductor layer, the oxide connection layer being disposed on the lower insulating layer and within the lower opening, and electrically connected to the lower conductive portion within the lower opening, an insulating layer covering the oxide connection layer, the insulating layer including an upper opening exposing a portion of the oxide connection layer, and an upper conductive portion disposed on the insulating layer and within the upper opening, and electrically connected to the oxide connection layer within the upper opening, and the oxide connection layer includes a region lower in a specific resistance than the channel region of the oxide semiconductor layer.

Item 2

The active matrix substrate described in Item 1, wherein the upper conductive portion in each of the plurality of terminal sections is formed using a conductive film the same as the pixel electrode and is separate from the pixel electrode.

Item 3

The active matrix substrate described in Item 1 or 2, wherein the plurality of source bus lines and the lower conductive portions in the plurality of wiring line connection sections include metal layers including Cu, Mo, or Al, and the oxide connection layer is in direct contact with the metal layer of the lower conductive portion within the lower opening in each of the plurality of wiring line connection sections.

Item 4

The active matrix substrate described in Item 3, wherein each of the metal layers is a Cu layer or an Al layer.

Item 5

The active matrix substrate described in Item 1 or 2, wherein the plurality of source bus lines and the lower conductive portions in the plurality of wiring line connection sections include conductive oxide layers, and the oxide connection layer is in direct contact with the oxide layer of the lower conductive portion within the lower opening in each of the plurality of wiring line connection sections.

Item 6

The active matrix substrate described in Item 5, wherein each of the oxide layers is an In—Zn—O based layer or an In—Ga—Zn—O based layer.

Item 7

The active matrix substrate described in any one of Items 1 to 6, wherein the lower opening at least partially overlaps the upper opening in each of the plurality of terminal sections when viewed from a normal direction of the substrate.

Item 8

The active matrix substrate described in any one of Items 1 to 7, wherein the plurality of wiring line connection sections further includes a plurality of source-gate connection sections disposed in the non-display region, each of the plurality of source-gate connection sections further includes the gate insulating layer extending over the lower insulating layer, and a gate conductive portion formed on the gate insulating layer using the second conductive film, and in each of the plurality of source-gate connection sections, the gate insulating layer covers only a first portion of a portion exposed by the lower opening of the oxide connection layer and does not cover a second portion, the gate conductive portion is disposed within the lower opening with the gate insulating layer disposed on the first portion of the oxide connection layer, the insulating layer extends over the gate conductive portion and the oxide connection layer, and the upper opening of the insulating layer is disposed to expose at least a portion of the second portion of the oxide connection layer and a portion of the gate conductive portion, the upper conductive portion is in contact with the at least the portion of the second portion of the oxide connection layer and the portion of the gate conductive portion within the upper opening, and the second portion of the oxide connection layer is lower in a specific resistance than the first portion of the oxide connection layer.

Item 9

The active matrix substrate described in any one of Items 1 to 7, wherein the oxide semiconductor TFT further includes another gate electrode formed using the first conductive film, and each of the plurality of wiring line connection sections includes a gate contact section connecting another gate electrode of the oxide semiconductor TFT to the one of the plurality of gate bus lines.

Item 10

The active matrix substrate described in Item 9, wherein the gate contact section further includes the gate insulating layer extending over the lower insulating layer, and a gate conductive portion formed on the gate insulating layer using the second conductive film, and in gate contact section the gate insulating layer covers only a third portion of a portion exposed by the lower opening of the oxide connection layer and does not cover a fourth portion, the gate conductive portion is disposed within the lower opening with the gate insulating layer disposed on the third portion of the oxide connection layer, the insulating layer extends over the gate conductive portion and the oxide connection layer, and the upper opening of the insulating layer is disposed to expose at least a portion of the fourth portion of the oxide connection layer and a portion of the gate conductive portion, the upper conductive portion is in contact with the at least the portion of the fourth portion of the oxide connection layer and the portion of the gate conductive portion within the upper opening, and the fourth portion of the oxide connection layer is lower in a specific resistance than the third portion of the oxide connection layer.

Item 11

The active matrix substrate described in Item 9,
wherein in the gate contact section,
the lower conductive portion is linked to another gate electrode,
the gate insulating layer extends over the oxide connection layer, and the gate insulating layer includes the upper opening exposing the portion of the oxide connection layer, and
the upper conductive portion is formed using the second conductive film, and is linked to the one of the plurality of gate bus lines.

Item 12

The active matrix substrate described in Item 10 or 11, wherein at least a portion of the oxide connection layer of the gate contact section overlaps with the one of the plurality of gate bus lines when viewed from the normal direction of the substrate.

Item 13

The active matrix substrate described in any one of Items 1 to 8,
wherein each of the plurality of pixel areas further includes a light blocking layer formed from the first conductive film, and the light blocking layer is linked to the source electrode.

Item 14

The active matrix substrate described in any one of Items 1 to 13, further including:
a protective insulating layer covering the oxide semiconductor TFT,
wherein the protective insulating layer is a reductive insulating layer capable of reducing the oxide semiconductor layer, is in direct contact with the first region, the second region, and the oxide connection layer of the oxide semiconductor layer, and is not contact with the channel region.

Item 15

The active matrix substrate described in any one of Items 1 to 14,
wherein the pixel electrode is in direct contact with the second region of the oxide semiconductor layer within a pixel contact hole formed in an insulating layer located between the oxide semiconductor layer and the pixel electrode.

Item 16

The active matrix substrate described in any one of Items 1 to 15,
wherein the oxide semiconductor layer includes an In—Ga—Zn—O based semiconductor.

Item 17

The active matrix substrate described in Item 16, wherein the In—Ga—Zn—O based semiconductor includes a crystalline portion.

Item 18

A manufacturing method of an active matrix substrate, the active matrix substrate including a display area including a plurality of pixel areas and a non-display region other than the display area, a plurality of source bus lines and a plurality of gate bus lines, an oxide semiconductor TFT and a pixel electrode disposed in each of the pixel areas, and a plurality of terminal sections, the manufacturing method including the steps of:

(a) forming a source metal layer on a substrate using a first conductive film, the source metal layer including a plurality of source bus lines and a lower conductive portion of each terminal section;

(b) forming a lower insulating layer covering the source metal layer;

(c) forming a source opening for connecting the oxide semiconductor TFT to one of the plurality of source bus lines and a lower opening exposing a portion of the lower conductive portion in the lower insulating layer;

(d) forming an oxide semiconductor film on the lower insulating layer, within the source opening, and within the lower opening, and patterning the oxide semiconductor film to form a first semiconductor section located on the lower insulating layer and within the source opening, the first semiconductor section serving as an active layer of the oxide semiconductor TFT, and a second semiconductor section connected to the portion of the lower conductive portion within the lower opening;

(e) forming a gate insulating film and a second conductive film in this order to cover the first semiconductor section and the second semiconductor section, and performing patterning to form a gate insulating layer from the gate insulating film, the gate insulating layer partially covering the first semiconductor section and not covering the second semiconductor section, to form a gate metal layer from the second conductive film, the gate metal layer including the plurality of gate bus lines and a gate electrode of the oxide semiconductor TFT;

(f) performing a low-resistance treatment in which a specific resistance of a portion of the first semiconductor section and the second semiconductor section exposed from the gate insulating layer is made lower than a portion of the first semiconductor section covered with the gate insulating layer, thereby forming an oxide semiconductor layer of the oxide semiconductor TFT from the first semiconductor section, and forming an oxide connection layer of each terminal section from the second semiconductor section;

(g) forming an insulating layer covering the gate metal layer and the oxide connection layer;

(h) forming an upper opening in the insulating layer, the upper opening exposing a portion of the oxide connection layer; and (i) forming an upper conductive portion of each terminal section on the insulating layer and within the upper opening, the upper conductive portion being electrically connected to the portion of the oxide connection layer within the upper opening.

Item 19

A manufacturing method of an active matrix substrate, the active matrix substrate including a display area including a plurality of pixel areas and a non-display region other than the display area, a plurality of source bus lines and a plurality of gate bus lines, an oxide semiconductor TFT and a pixel electrode disposed in each of the pixel areas, and a plurality of gate contact sections, the manufacturing method including the steps of:

(a) forming a source metal layer on a substrate using a first conductive film, the source metal layer including a plurality of source bus lines and a lower conductive portion of each gate contact section;

(b) forming a lower insulating layer covering the source metal layer;

(c) forming a source opening for connecting the oxide semiconductor TFT to one of the plurality of source bus lines and a lower opening exposing a portion of the lower conductive portion in the lower insulating layer;

(d) forming an oxide semiconductor film on the lower insulating layer, within the source opening, and within the lower opening, and patterning the oxide semiconductor film to form a semiconductor section located on the lower insulating layer and within the source opening, the semiconductor section serving as an active layer of the oxide semiconductor TFT, and another semiconductor section connected to the portion of the lower conductive portion within the lower opening;

(e) forming a gate insulating film on a portion of the semiconductor section and on another semiconductor section, the gate insulating film including an upper opening exposing a portion of another semiconductor section;

(f) performing a low-resistance treatment in which a specific resistance of the semiconductor section and another semiconductor section exposed from the gate insulating layer is made lower than a portion covered with the gate insulating layer, thereby forming an oxide semiconductor layer of the oxide semiconductor TFT from the semiconductor section, and forming an oxide connection layer of each gate contact section from another semiconductor section; and (g) forming a gate metal layer disposed on the gate insulating layer, the gate metal layer including the plurality of gate bus lines, a gate electrode of the oxide semiconductor TFT, and an upper conductive portion of each gate contact section, the upper conductive portion being in contact with the portion of the oxide connection layer within the upper opening.

Item 20

The manufacturing method described in Item 18 or 19, wherein the first conductive film includes a metal film including Cu, Al, or Mo, in step (c), the lower opening is formed to expose a surface of the metal film, and in the step (d), patterning the oxide semiconductor film is performed using a PAN based etching solution containing phosphoric acid, nitric acid, and acetic acid.

Item 21

The manufacturing method described in Item 18 or 19, wherein the first conductive film includes a conductive metal oxide film, in step (c), the lower opening is formed to expose a surface of the metal oxide film, and in the step (d), patterning the oxide semiconductor film is performed using a PAN based etching solution containing phosphoric acid, nitric acid, and acetic acid.

Item 22

The manufacturing method described in any one of Items 18 to 21, wherein the oxide semiconductor film includes an In—Ga—Zn—O based semiconductor.

Item 23

The manufacturing method described in Item 22, wherein the In—Ga—Zn—O based semiconductor includes a crystalline portion.

According to an embodiment of the disclosure, provided is an active matrix substrate including an oxide semiconductor TFT and a wiring line connection section, and capable of reducing a parasitic capacitance.

BRIEF DESCRIPTION OF DRAWINGS

The disclosure will be described with reference to the accompanying drawings, wherein like numbers reference like elements.

DESCRIPTION OF EMBODIMENTS

The present inventors studied a manufacturing process of an active matrix substrate (bottom source structure substrate) having a bottom source structure, and obtained the following findings.

Figure 21A:
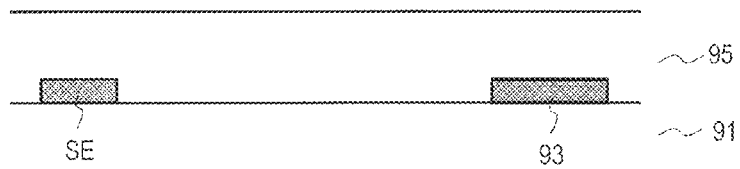
FIG. 21A is a process cross-sectional view illustrating a manufacturing process of a wiring line connection section according to a reference example.
Figure 21B:
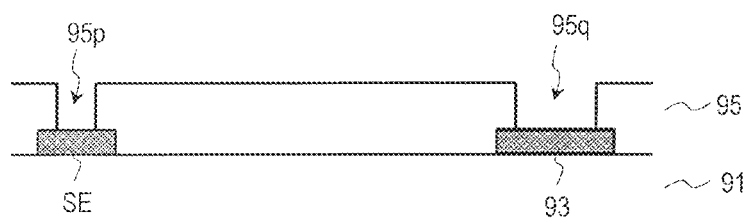
FIG. 21B is a process cross-sectional view illustrating the manufacturing process of the wiring line connection section according to the reference example.
Figure 21C:
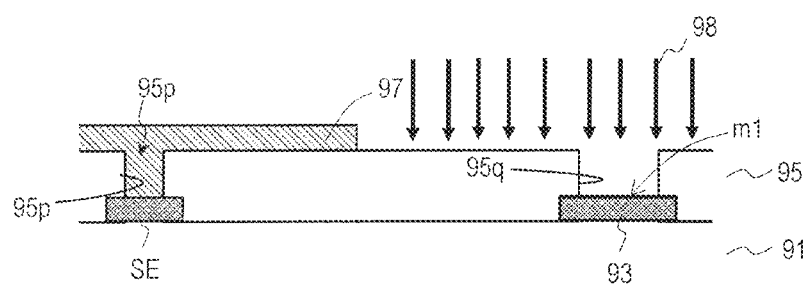
FIG. 21C is a process cross-sectional view illustrating the manufacturing process of the wiring line connection section according to the reference example.

FIG. 21A to FIG. 21C are a schematic process cross-sectional view for describing a reference example of a manufacturing process of a bottom source structure substrate. Here, a portion of a process for manufacturing an oxide semiconductor TFT and a wiring line connection section will be described as an example. The wiring line connection section is formed using the same conductive film as that of a source bus line.

First, as illustrated in FIG. 21A, formed on a substrate 91 is a source metal layer including a source bus line, a source electrode SE, a lower conductive portion 93 constituting a wiring line connection section, and the like. Next, a lower insulating layer 95 is formed to cover the source metal layer.

Thereafter, as illustrated in FIG. 21B, an opening is formed in the lower insulating layer 95, and a surface of a portion of the source metal layer is exposed. In this example, a source opening 95$p$ exposing a portion of the source electrode SE and a connection section opening 95$q$ exposing a portion of the lower conductive portion 93 are formed.

Subsequently, as illustrated in FIG. 21C, an oxide semiconductor film (for example, an In—Ga—Zn—O based semiconductor film) is formed on the lower insulating layer 95, and the oxide semiconductor film is patterned to obtain an oxide semiconductor layer 97. The oxide semiconductor layer 97 is in contact with the source electrode SE within the source opening 95$p$.

In the above process, the oxide semiconductor film may be patterned by wet etching. In this case, a surface m1 of the source metal layer exposed in the connection section opening 95$q$ (in this example, a surface of the lower conductive portion 93 exposed in the connection section opening 95$q$) is exposed to an etching solution 98. As a result, the exposed surface m1 of the source metal layer may degrade or the material of the source metal layer may be eluted.

As an example, in a case where a PAN etching solution containing phosphoric acid, nitric acid, and acetic acid is used as the etching solution 98, and a Cu layer is used as the source metal layer (as a top layer in a case where the source metal layer has a layered structure), Cu is eluted from the exposed surface m1 of the source metal layer into the etching solution 98. As a result, a contact resistance between the lower conductive portion 93 and a conductive layer formed thereon may increase in the wiring line connection section. In addition, as a result of the oxide semiconductor layer 97 being affected by the etching solution 98 including Cu, TFT characteristics may be decreased. Note that, in addition to Cu, metal such as Al and Mo, oxide material such as indium zinc oxide (In—Zn—O) and indium gallium zinc oxide (In—Ga—Zn—O), and the like may be also eluted into the PAN based etching solution, which may cause similar problems.

Even in a case where the surface m1 of the source metal layer has tolerability to the etching solution 98, the surface m1 of the source metal layer may deteriorate due to the etching solution 98. Furthermore, after patterning the oxide semiconductor film, in a case where an additional insulating film (not illustrated) is formed on the lower insulating layer 95 and in the connection section opening 95q, the exposed surface m1 of the source metal layer may be damaged.

In this way, in the bottom source structure substrate, in a region where a wiring line connection section such as a terminal section is formed, problems as described above may arise due to the process performed after exposing the surface of the source metal layer.

As a result of studying based on the above knowledge, the present inventors have found that in a case of manufacturing the wiring line connection section, it is possible to suppress a decrease in the characteristics of the wiring line connection section and the oxide semiconductor TFT by protecting the exposed surface of the source metal layer using the oxide semiconductor film, and thus have conceived of the disclosure.

First Embodiment

Hereinafter, an active matrix substrate according to a first embodiment will be described with reference to the drawings.

Figure 1:
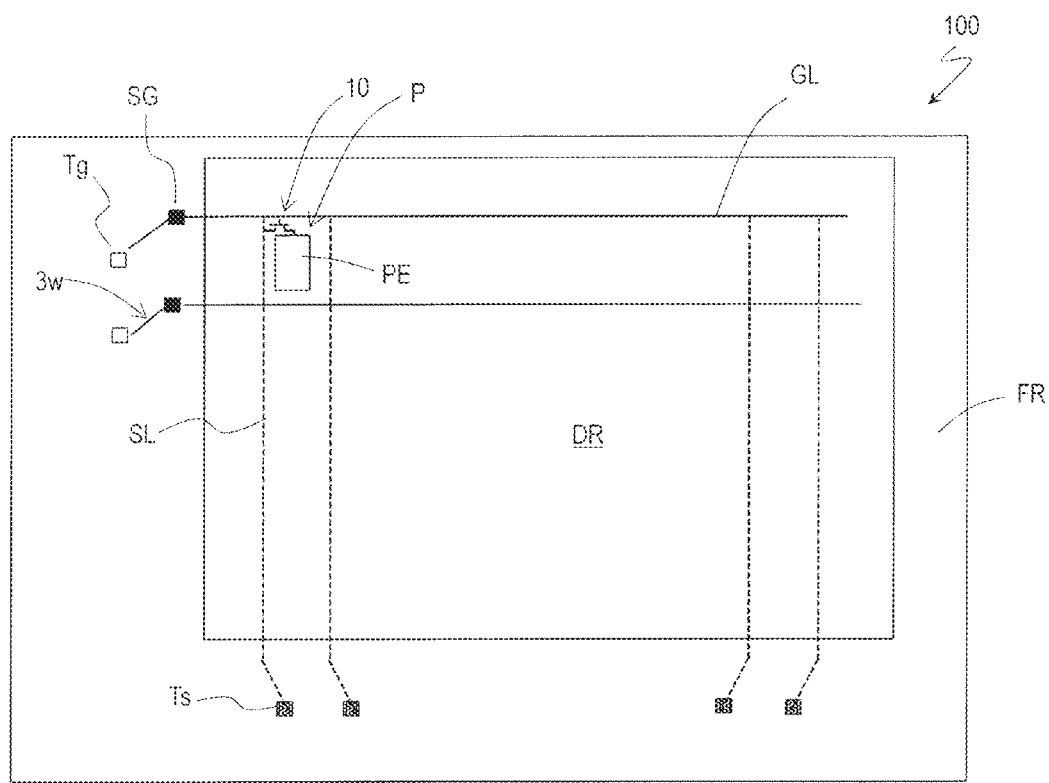
FIG. 1 is a schematic diagram illustrating an example of a planar structure of an active matrix substrate 100 according to a first embodiment.

FIG. 1 is a diagram schematically illustrating an example of a planar structure of an active matrix substrate 100. The active matrix substrate 100 includes a display region DR, and a peripheral region (a frame region) FR located outside the display region DR.

Provided in the display region DR are a plurality of source bus lines SL extending in a first direction and a plurality of gate bus lines GL extending in a second direction intersecting (perpendicular to, in this case) the first direction. Each of regions surrounded by these bus lines is a "pixel area P". The pixel area P (also referred to as a "pixel") is a region corresponding to a pixel of the display device. A plurality of pixel areas P are arranged in a matrix. A pixel electrode PE and an oxide semiconductor TFT (hereinafter simply referred to as a "TFT") 10 is formed in association with each pixel area P. A gate electrode of each TFT 10 is electrically connected to a corresponding gate bus line GL. A portion (first region) of an oxide semiconductor layer of each TFT 10 is electrically connected to the source bus line SL, and another portion (second region) is electrically connected to a pixel electrode PE.

Although not illustrated, in a case where the active matrix substrate 100 is applied to a display device of a transverse electric field mode such as a Fringe Field Switching (FFS) mode, a common electrode is provided in the active matrix substrate 100 to face the pixel electrode PE with an insulating layer (dielectric layer) interposed therebetween.

Wiring line connection sections such as a plurality of gate terminal sections Tg, a plurality of source terminal sections Ts, and a plurality of source-gate connection sections SG are disposed in the peripheral region FR. Each of the gate bus lines GL is connected to a gate driver (not illustrated) with a corresponding gate terminal section Tg interposed therebetween. Each of the source bus lines SL is connected to a source driver (not illustrated) with a corresponding source terminal section Ts interposed therebetween. The gate driver and the source driver may be monolithically formed on the active matrix substrate 100 or may be implemented.

The source-gate connection section SG is a connection changing portion between wiring lines formed in the source metal layer (or formed using the same conductive film as that of the source bus line SL) and wiring lines formed in the gate metal layer (or formed using the same conductive film as that of the gate bus line GL). As illustrated, the source-gate connection section SG may be disposed between each gate bus line GL and the gate terminal section Tg, for example, and the gate bus line GL may be connected to a connection wiring line (source connection wiring line) 3w formed in the source metal layer. The source connection wiring line 3w is connected to the gate driver via the gate terminal section Tg. In this case, the source terminal section Ts and the gate terminal section Tg may have the same structure.

Next, each region of the active matrix substrate 100 of the present embodiment will be described in more detail.

In the following description, a layer formed using the same conductive film (first conductive film) as that of the source bus line SL is referred to as a "source metal layer M1" and a layer formed using the same conductive film (second conductive film) as that of the gate bus line GL is referred to as a "gate metal layer M2". A layer formed using the same conductive film (first transparent conductive film) as that of the pixel electrode PE is referred to as a "pixel electrode layer TP" and a layer formed using the same conductive film (second transparent conductive film) as that of the common electrode CE is referred to as a "common electrode layer TC". Furthermore, a layer formed using the same oxide film as that of the oxide semiconductor layer that serves as an active layer of the TFT is referred to as a "metal oxide layer OS". The metal oxide layer OS includes not only a semiconductor region, but also a low-resistance region in which the oxide semiconductor is reduced to be low-resistive or conductive.

In the drawings, after a reference sign of each constituent element, a layer in which the constituent element is formed may be represented in parentheses. For example, electrodes or wiring lines formed in the source metal layer M1 may be designated by the reference signs thereof suffixed with "(M1)".

Pixel Region P

Hereinafter, a structure of the pixel area P of the active matrix substrate of the present embodiment will be described using an active matrix substrate applied to a display device of the FFS mode, with reference to the drawings. The FFS mode is a mode of a lateral electric field scheme of providing a pair of electrodes in one of substrates, and applying an electric field to a liquid crystal molecule in a direction (lateral direction) parallel to a substrate plane.

Figure 2A:
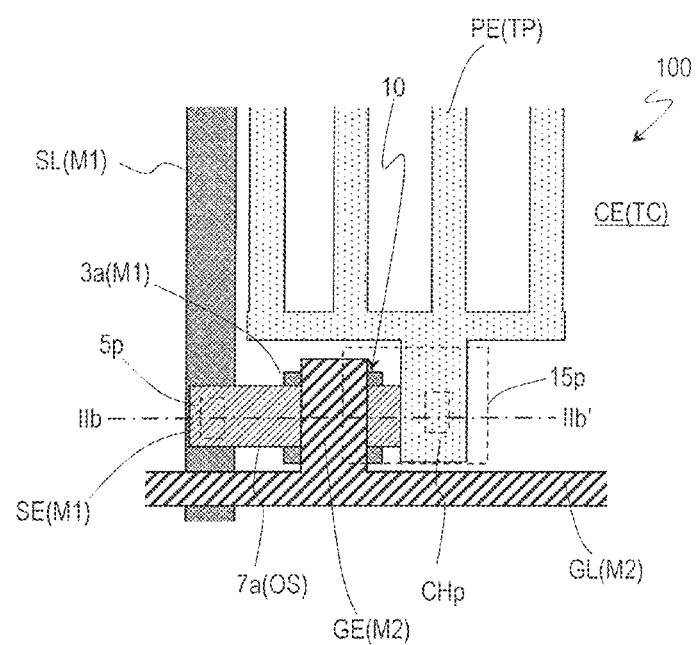
FIG. 2A is a plan view illustrating a pixel area in the active matrix substrate 100.
Figure 2B:
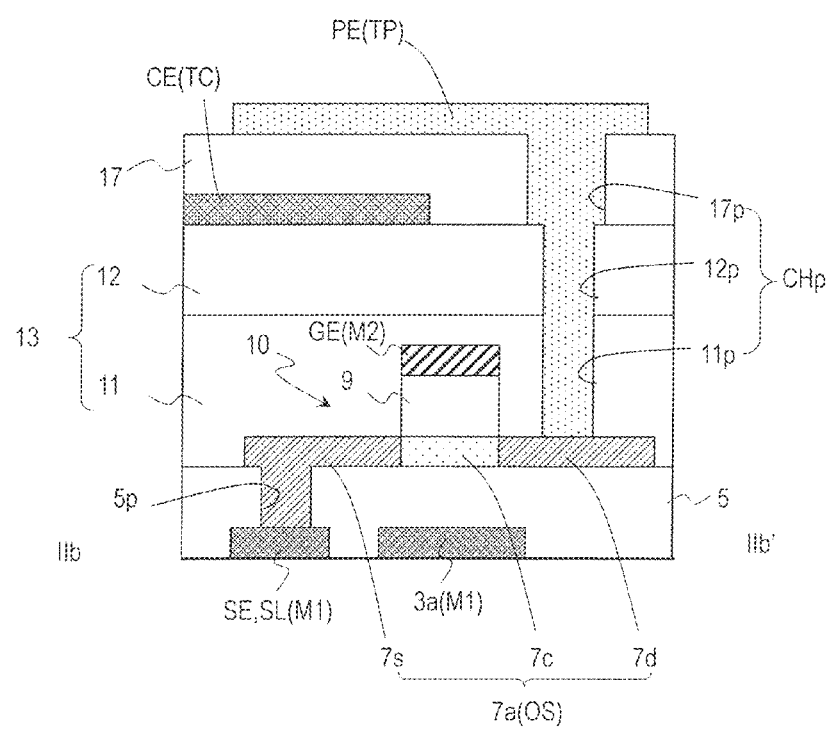
FIG. 2B is a cross-sectional view illustrating the pixel area in the active matrix substrate 100.

FIG. 2A is a plan view illustrating each pixel area P in the active matrix substrate 100, and FIG. 2B is a cross-sectional view taken along a line IIb-IIb' across the TFT 10 in the pixel area P.

The active matrix substrate 100 includes a substrate 1, a plurality of source bus lines SL and a plurality of gate bus lines GL supported by the substrate 1. Each pixel area P is defined by the one source bus line SL and one gate bus line GL. Each pixel area P includes the TFT 10 having a top gate structure, the pixel electrode PE, and the common electrode CE.

First, a layer structure of the active matrix substrate 100 will be described with reference to FIG. 2B. The active matrix substrate 100 includes, in order from the substrate 1 side, a source metal layer M1, a lower insulating layer 5 covering the source metal layer M1, a metal oxide layer OS, a gate insulating layer 9, and a gate metal layer M2. In other words, the source bus line SL is disposed closer to the substrate 1 than an oxide semiconductor layer 7a serving as the active layer of the TFT 10 (bottom source structure). The gate metal layers M2 and the TFT 10 are covered with an upper insulating layer 13 including a protective insulating layer 11. Formed on the upper insulating layer 13 are the common electrode layer TC including the common electrode CE, a dielectric layer 17, and a pixel electrode layer TP including the pixel electrode PE in this order. As described below, the common electrode layer TC may be formed on the pixel electrode layer TP with the dielectric layer 17 interposed therebetween.

The TFT 10 includes the oxide semiconductor layer 7a disposed on the lower insulating layer 5 and a gate electrode GE disposed on a portion of the oxide semiconductor layer 7a with the gate insulating layer 9 interposed therebetween.

The oxide semiconductor layer 7a includes a channel region 7c, and a first region 7s and a second region 7d disposed on both sides of the channel region 7c. The first region 7s and the second region 7d are low-resistance regions having specific resistances lower than the channel regions 7c.

The gate electrode GE is disposed to overlap the channel region 7c when viewed from a normal direction of the substrate 1. The gate insulating layer 9 may cover the channel region 7c and may not cover the first region 7s and the second region 7d.

The oxide semiconductor layer 7a is disposed on the lower insulating layer 5 and within the source opening 5p formed in the lower insulating layer 5. The first region 7s of the oxide semiconductor layer 7a is electrically connected to a corresponding source bus line SL within the source opening 5p. The first region 7s may be connected to the source electrode SE formed using the same conductive film (first conductive film) as that of the source bus line SL and electrically connected to the source bus line SL via the source electrode SE. The source electrode SE may be linked to the source bus line SL. For example, when viewed from the normal direction of the substrate 1, the source electrode SE may be formed on an extending portion or protrusion (branch portion) extending in a direction different from a first direction from a portion of a side surface of the source bus line SL that extends in the first direction. The source electrode SE may be a portion of the source bus line SL. In such a case, the portion of the source bus line SL connected to the first region 7s may be referred to as the "source electrode SE". In this example, the first region 7s of the oxide semiconductor layer 7a extends to overlap a portion of the source bus line SL when viewed from the normal direction of the substrate 1. The lower face of the first region 7s is in direct contact with the source bus line SL (the source electrode SE that is a portion of the source bus line SL) within the source opening 5p.

The second region 7d of the oxide semiconductor layer 7a is electrically connected to the pixel electrode PE. The upper face of the second region 7d may be in direct contact with the pixel electrode PE.

The gate electrode GE of the TFT 10 is electrically connected to a corresponding gate bus line GL. The gate electrode GE is formed using the same conductive film (second conductive film) as that of the gate bus line GL. The gate electrode GE may be linked to (formed integrally with) the gate bus line GL. For example, when viewed from the normal direction of the substrate 1, the gate electrode GE may be formed on an extending portion or protrusion (branch portion) extending in a direction different from a second direction from a portion of a side surface of the gate bus line GL that extends in the second direction. Alternatively, the gate electrode GE may be a portion of the gate bus line GL. In this case, the portion of the gate bus line GL that overlaps the oxide semiconductor layer 7a when viewed from the normal direction of the substrate 1 may be referred to as the "gate electrode GE".

The TFT 10 may include a light blocking layer 3a closer to the substrate 1 than the oxide semiconductor layer 7a. The light blocking layer 3a may be formed of the same first conductive film as that of the source bus line SL, for example. When viewed from the normal direction of the substrate 1, the light blocking layer 3a may be disposed to overlap at least the channel region 7c of the oxide semiconductor layer 7a. This can suppress degradation in properties of the oxide semiconductor layer 7a caused by light from the substrate 1 side (backlight light).

The upper insulating layer 13 is formed to cover the TFT 10 and the gate metal layer M2. The upper insulating layer 13 includes the protective insulating layer (passivation film) 11, for example. As the protective insulating layer 11, a reductive insulating film (for example, a silicon nitride film) capable of reducing an oxide semiconductor may be used. In this case, a specific resistance of a portion of the oxide semiconductor layer 7a in contact with the protective insulating layer 11 (the first region 7s and the second region 7d) can be lower than that of a portion (channel region 7c) that is not in contact with the protective insulating layer 11.

As illustrated, the upper insulating layer 13 may have a layered structure including the protective insulating layer (for example, an inorganic insulating layer) 11 and an organic insulating layer 12 formed on the protective insulating layer 11. The organic insulating layer 12 may not be formed. Alternatively, the organic insulating layer 12 may be formed only in the display region.

The common electrode CE is formed on the upper insulating layer 13. The common electrode CE may not be separated for each pixel area P. For example, the common electrode CE may include an opening 15p in a region (pixel contact region) where a pixel contact hole CHp is formed, and may be formed across the entire pixel area P except for the pixel contact region.

The pixel electrode PE is disposed on the common electrode CE with the dielectric layer 17 interposed therebetween. The pixel electrodes PE are separated for each pixel area P. In each pixel area P, one or a plurality of slits (openings) 19s or notches are provided in the pixel electrode PE.

The pixel electrode PE is disposed on the dielectric layer 17 and is connected to the second region 7d of the oxide semiconductor layer 7a within the pixel contact holes CHp formed in the upper insulating layer 13 and the dielectric layer 17. In this example, the pixel contact hole CHp is constituted by an opening 11p in the protective insulating layer 11, an opening 12p in the organic insulating layer 12, and an opening 17p in the dielectric layer 17.

Wiring Line Connection Section (Terminal Section T)

Figure 3A:
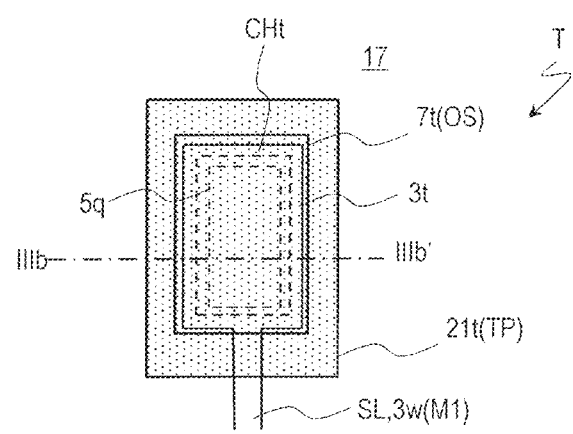
FIG. 3A is a plan view illustrating a wiring line connection section (terminal section T) in the active matrix substrate 100.
Figure 3B:
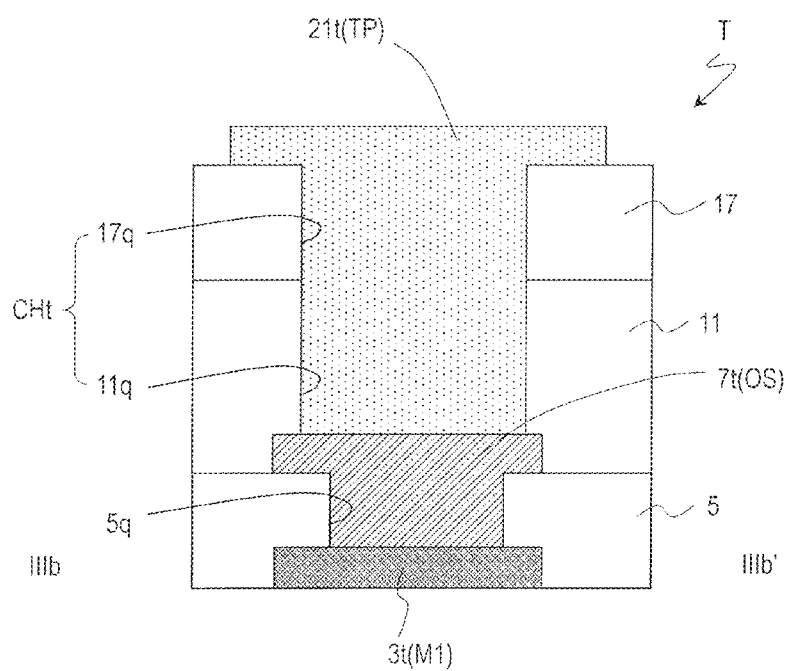
FIG. 3B is a cross-sectional view illustrating a wiring line connection section (terminal section T) in the active matrix substrate 100.

Next, a structure of the wiring line connection section in the present embodiment will be described with reference to the terminal section as an example. FIG. 3A is a plan view illustrating the source terminal section Ts and/or the gate terminal section Tg (hereinafter, collectively referred to as the "terminal section T"). FIG. 3B is a cross-sectional view taken along a line IIIb-IIIb' across the terminal section T.

The terminal section T includes a first lower conductive portion 3t formed in the source metal layer M1 (specifically, using the first conductive film), the lower insulating layer 5 extending over the first lower conductive portion 3t, a first oxide connection layer 7t formed in the metal oxide layer OS (specifically, using the oxide semiconductor film), and a first upper conductive portion 21t.

The first lower conductive portion 3t may be an end portion of the source bus line SL (source terminal section Ts). Alternatively, the first lower conductive portion 3t may be an end portion of the source connection wiring line 3w connected to the gate bus line GL via the source-gate connection section SG (gate terminal section Tg).

The lower insulating layer 5 includes a first lower opening 5q exposing a portion of the first lower conductive portion 3t.

The first oxide connection layer 7t is connected to the first lower conductive portion 3t within the first lower opening 5q formed in the lower insulating layer 5. The first oxide connection layer 7t has a specific resistance lower than the channel region 7c. The first oxide connection layer 7t is disposed separately from the oxide semiconductor layer 7a (separated from the oxide semiconductor layer 7a). The first oxide connection layer 7t may be disposed on the lower insulating layer 5 and within the first lower opening 5q. The first oxide connection layer 7t may be in direct contact with the first lower conductive portion 3t within the first lower opening 5q. The first oxide connection layer 7t preferably covers the entire surface of the first lower conductive portion 3t exposed by the first lower opening 5q.

The first oxide connection layer 7t is covered with an insulating layer. The insulating layer has a terminal section contact hole CHt (also referred to as a "first upper opening") exposing at least a portion of the first oxide connection layer 7t. In this example, the insulating layer includes the protective insulating layer 11 and the dielectric layer 17 extending over the first oxide connection layer 7t. The terminal section contact hole CHt includes an opening 11q formed in the protective insulating layer 11 and an opening 17q formed in the dielectric layer 17. The organic insulating layer 12 may not be formed in the terminal section formation region. When viewed from the normal direction of the substrate 1, the terminal section contact hole CHt may at least partially overlap the first lower opening 5q.

The first upper conductive portion 21t is connected to the first oxide connection layer 7t within the terminal section contact hole CHt formed on and in the insulating layer. Specifically, the first upper conductive portion 21t is electrically connected to the first lower conductive portion 3t with the first oxide connection layer 7t interposed therebetween. The first upper conductive portion 21t may be in direct contact with the first oxide connection layer 7t within the terminal section contact hole CHt.

The first upper conductive portion 21t is formed, for example, in the pixel electrode layer TP (specifically, using the first transparent conductive film). The first upper conductive portion 21t may be an island-shaped portion separated from the pixel electrode PE. in a case where the first upper conductive portion 21t is formed in the pixel electrode layer TP, the protective insulating layer 11 and the dielectric layer 17 are collectively patterned to simultaneously form the pixel contact hole CHp and the terminal section contact hole CHt advantageously.

Note that the first upper conductive portion 21t may be formed using another conductive film formed above the protective insulating layer 11. For example, the first upper conductive portion 21t may be formed in the common electrode layer TC.

As described above with reference to FIGS. 21A to 21C, in the manufacturing process of the reference example, the surface m1 of the source metal layer exposed by the opening in the lower insulating layer 95 may be damaged by the subsequent processes (such as the etching process of an oxide semiconductor film, the forming process of an insulating layer, etc.). In contrast, in the active matrix substrate 100 of the present embodiment, the surface of the source metal layer M1 exposed by forming the opening in the lower insulating layer 5 can be protected using the metal oxide layer OS. For example, in the terminal section T, the surface of the first lower conductive portion 3t exposed by the first lower opening 5q is covered with an oxide semiconductor film serving as the first oxide connection layer 7t. Accordingly, the surface of the first lower conductive portion 3t can be prevented from being damaged by the etching process of the oxide semiconductor film and then the forming process of the gate insulating layer 9 and the protective insulating layer 11, and the like. The oxide semiconductor film covering the first lower conductive portion 3t is reduced to be low-resistive to serve as the first oxide connection layer 7t. Thus, the first lower conductive portion 3t can be electrically connected to the first upper conductive portion 21t with the first oxide connection layer 7t interposed therebetween, obtaining a favorable contact.

Furthermore, according to the present embodiment, in a case of patterning the oxide semiconductor film, the exposed surface of the source metal layer M1 is protected by the oxide semiconductor film serving as the first oxide connection layer 7t, and therefore, contact between the exposed surface of the source metal layer M1 and the etching solution is suppressed. Therefore, elution of metal elements such as Cu from the exposed surface of the source metal layer M1 into the etching solution (e.g. PAN based etching solution) is suppressed. As a result, an increase in the contact resistance between the first lower conductive portion 3t and the first upper conductive portion 21t due to the elution of the metal element can be suppressed. In addition, a decrease in the characteristics of the oxide semiconductor layer 7a due to the etching solution including eluted Cu can be suppressed.

As described above, according to the present embodiment, even in a case where a metal element such as Cu, Al, or Mo or an electrically conductive oxide material is used in the source metal layer M1 (the top layer thereof in a case where the source metal layer M1 has a layered structure), the problem caused by the etching solution of the oxide semiconductor film is hard to occur. As a result, a degree of freedom of selecting the material, the structure, and the etching solution of the oxide semiconductor film for the source metal layer M1 can be increased.

In the present embodiment, the source metal layer M1 may have a single layer structure of a metal layer (including an alloy layer) including Cu, Al, or Mo, for example, or may have a layered structure with a metal layer including Cu, Al, or Mo as the top layer. To be more specific, the source metal layer M1 may have a layered structure including a lower layer such as a Ti layer and an upper layer such as a Cu layer and an Al layer (Cu/Ti structure, Al/Ti structure). Alternatively, the source metal layer M1 may be a single layer such as a Cu layer, an Al layer, or the like.

The source metal layer M1 may have a layered structure with an electrically conductive oxide layer such as an In—Zn—O layer, an In—Ga—Zn—O layer, or the like as an upper layer. For example, a Cu layer may be a main layer and the In—Zn—O layer may be provided as an upper layer of the Cu layer.

Note that a layer (Ti layer, for example) having tolerability to the PAN based etching solution may be provided on the main layer (Cu layer, Al layer, or the like) of the source metal layer M1. However, as described below, in a case of providing the Ti layer, etching of the source metal layer M1 may be performed in two stages, as follows.

Figure 22A:
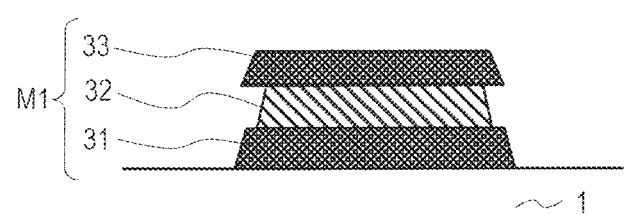
FIG. 22A is a process cross-sectional view illustrating a wet etching of a Ti/Cu/Ti film.
Figure 22B:
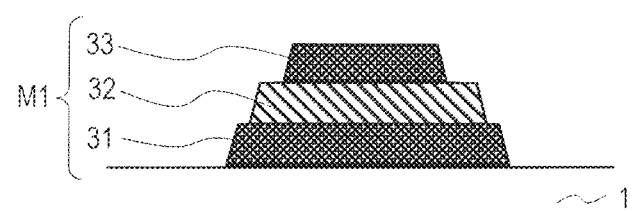
FIG. 22B is a process cross-sectional view illustrating the wet etching of the Ti/Cu/Ti film.

FIGS. 22A and 22B are process cross-sectional views illustrating a method for etching a source metal layer M1 having a layered film (Ti/Cu/Ti film) including a Ti film 31, a Cu film 32, and a Ti film 33 in this order from the substrate 1 side.

The Ti/Cu/Ti film is patterned using a resist mask (not illustrated), for example, by wet etching. At this time, as illustrated in FIG. 22A, since an etch rate of the Cu film 32 is higher than the Ti film 33 of the upper layer, the Ti film 33 may overhang the Cu film 32 like a canopy and a good tapered shape may not be obtained. This may be a factor that reduces a coverage of the lower insulating layer 5, which may cause corrosion of the source metal layer M1 and the like. For this reason, after wet etching, as illustrated in FIG. 22B, etching (for example, dry etching) of the Ti film 33 serving as an upper layer is performed separately using another resist mask (not illustrated). As a result, electrodes and wiring lines having a favorable tapered shape on the side surface can be formed. In this way, in a case where the source metal layer M1 having a Ti layer on the upper face is used, the source metal layer M1 may be patterned by two stages of etching, increasing the photolithography process.

In contrast, according to the present embodiment, a conductive layer high in the etching resistance such as Ti layer may not be formed on the Cu layer of the source metal layer M1. Therefore, two stages of etching are not required for the source metal layer M1. For example, by wet etching one time the source metal layer M1 having a Cu/Ti structure, wiring or the like having a good tapered shape can be formed.

The structure and effect of the wiring line connection section according to the present embodiment has been described above with reference to the terminal section T as an example. Note that the wiring line connection section according to the present embodiment may include the lower conductive portion formed in the source metal layer M1, the lower insulating layer covering the lower conductive portion, the oxide connection layer formed in the metal oxide layer OS and electrically connected to the lower conductive portion within the lower opening formed in the lower insulating layer, the insulating layer covering the oxide connection layer, and the upper conductive portion disposed on the insulating layer and electrically connected to the oxide connection layer within the upper opening formed in the insulating layer, and is not limited to the terminal section T. The active matrix substrate according to the present embodiment may further include other connection sections (for example, a plurality of source-gate connection sections SG) disposed in the non-display region as wiring line connection sections, or may include other connection sections disposed in the display region.

Another Wiring Line Connection Section (Source-Gate Connection Section)

The active matrix substrate 100 may further include the source-gate connection section SG in addition to the terminal section T as a wiring line connection section.

Figure 4:
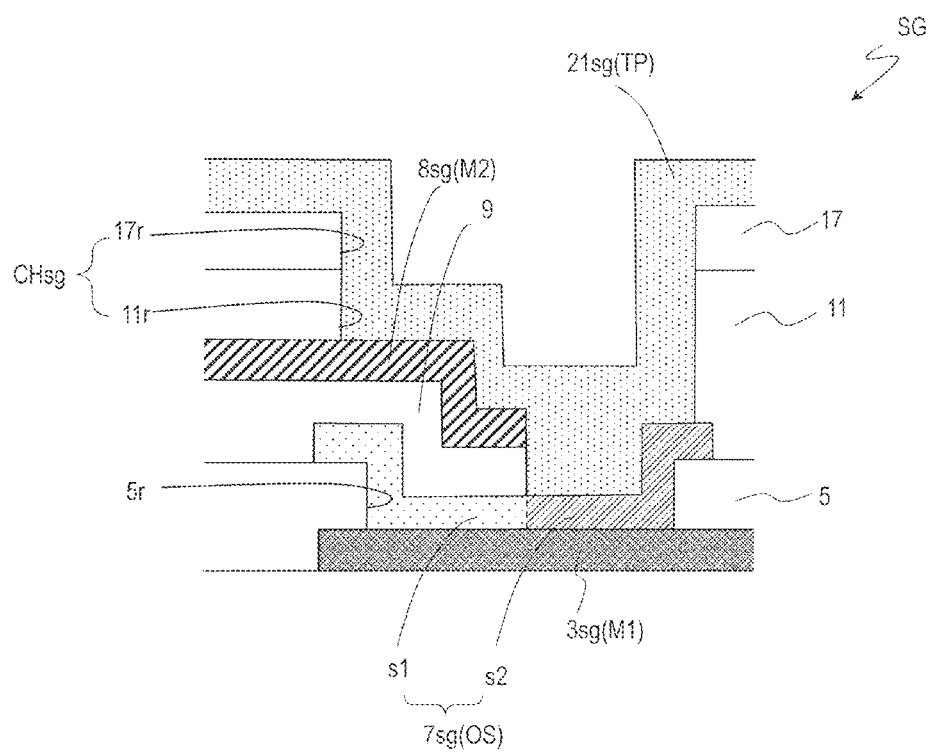
FIG. 4 is a cross-sectional view illustrating another wiring line connection section (source-gate connection section SG) in the active matrix substrate 100.

FIG. 4 is a cross-sectional view illustrating the source-gate connection section SG.

The source-gate connection section SG is a connection section that electrically connects a second lower conductive portion 3sg formed in the source metal layer M1 to a gate conductive portion 8sg formed in the gate metal layer M2. In this example, the second lower conductive portion 3sg is electrically connected to the gate conductive portion 8sg via a second upper conductive portion 21sg. The gate conductive portion 8sg may be a portion of the gate bus line GL. The second lower conductive portion 3sg may be a portion of the source connection wiring line 3w that links the gate bus line GL to the gate terminal section Tg. The second upper conductive portion 21sg may be formed in the pixel electrode layer TP.

The source-gate connection section SG includes the second lower conductive portion 3sg, the lower insulating layer 5 extending over the second lower conductive portion 3sg, and a second oxide connection layer 7sg formed in the metal oxide layer OS. The lower insulating layer 5 includes a second lower opening 5r exposing a portion of the second lower conductive portion 3sg. The second oxide connection layer 7sg is disposed on the lower insulating layer 5 and within the second lower opening 5r, and is connected to the second lower conductive portion 3sg within the second lower opening 5r. The second oxide connection layer 7sg is disposed separately (separated) from the oxide semiconductor layer 7a.

The gate insulating layer 9 is disposed on the second oxide connection layer 7sg to cover only a portion (first portion) s1 of the portion exposed by the second lower opening 5r in the second oxide connection layer 7sg. The gate conductive portion 8sg is disposed over the first portion s1 with the gate insulating layer 9 interposed therebetween. An insulating layer (here, the protective insulating layer 11 and the dielectric layer 17) extends over the gate conductive portion 8sg and the second oxide connection layer 7sg. The organic insulating layer 12 may not extend over the gate conductive portion 8sg and the second oxide connection layer 7sg.

A SG contact hole CHsg (also referred to as a second upper opening) is formed in the insulating layer described above (the protective insulating layer 11 and the dielectric layer 17). In this example, the SG contact hole CHsg includes an opening 11r formed in the protective insulating layer 11 and an opening 17r formed in the dielectric layer 17. The SG contact hole CHsg is disposed to expose a portion of the gate conductive portion 8sg and at least a portion of a second portion s2 of the second oxide connection layer 7sg not covered with the gate insulating layer 9. The first portion s1 of the second oxide connection layer 7sg covered with the gate insulating layer 9 is a semiconductor region, and the second portion s2 not covered with the gate insulating layer 9 is a low-resistance region having a specific resistance lower than the first portion s1.

The second upper conductive portion 21sg is disposed on the insulating layer described above (here, on the dielectric layer 17) and within the SG contact hole CHsg. The second upper conductive portion 21sg is connected to (here, in direct contact with) both a portion of the second portion s2 of the second oxide connection layer 7sg and a portion of the gate conductive portion 8sg within the SG contact hole CHsg.

The second upper conductive portion 21sg may be formed in the pixel electrode layer TP or may be formed in another conductive layer. In a case where the second upper conductive portion 21sg is formed in the pixel electrode layer TP, the protective insulating layer 11 and the dielectric layer 17 are collectively patterned to simultaneously form the pixel contact hole CHp and the SG contact hole CHsg advantageously.

Manufacturing Method of Active Matrix Substrate 100

Next, a manufacturing method of the active matrix substrate 100 will be described with reference to the drawings.

In the method illustrated here, eight photolithography processes are performed (eight photomasks are used) to pattern the source metal layer M1, the lower insulating layer 5, the metal oxide layer OS, the gate metal layer M2, the organic insulating layer 12, the common electrode layer TC, the dielectric layer 17 (and the protective insulating layer 11), and the pixel electrode layer TP. Thus, a process that requires eight photomasks may be referred to as an "eight mask process."

Figure 5A:
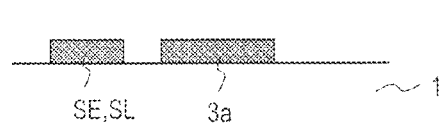
FIG. 5A is a process cross-sectional view illustrating a portion of the pixel area.
Figure 5B:
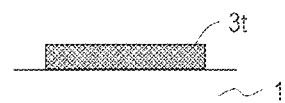
FIG. 5B is a process plan view illustrating a portion of the pixel area.
Figure 5C:
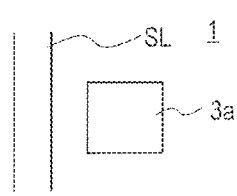
FIG. 5C is a process cross-sectional view illustrating a portion of a terminal section formation region.
Figure 5D:
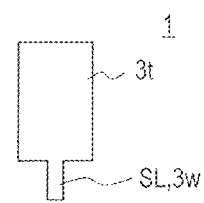
FIG. 5D is a process plan view illustrating a portion of the terminal section formation region.
Figure 6A:
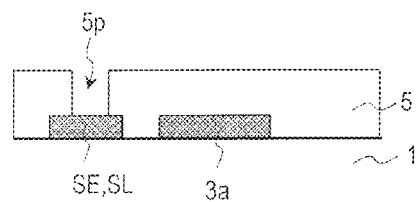
FIG. 6A is a process cross-sectional view illustrating a portion of the pixel area.
Figure 6B:
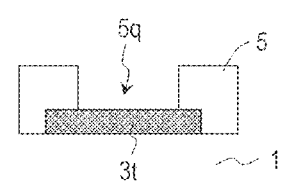
FIG. 6B is a process plan view illustrating a portion of the pixel area.
Figure 6C:
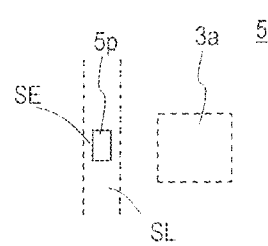
FIG. 6C is a process cross-sectional view illustrating a portion of the terminal section formation region.
Figure 6D:
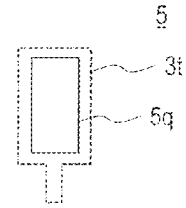
FIG. 6D is a process plan view illustrating a portion of the terminal section formation region.
Figure 7A:
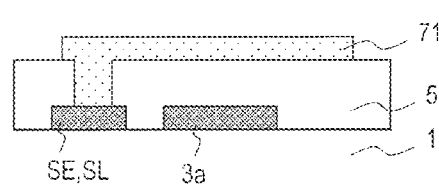
FIG. 7A is a process cross-sectional view illustrating a portion of the pixel area.
Figure 7B:
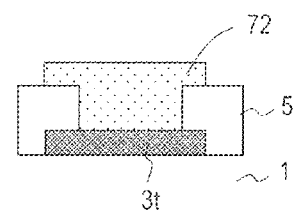
FIG. 7B is a process plan view illustrating a portion of the pixel area.
Figure 7C:
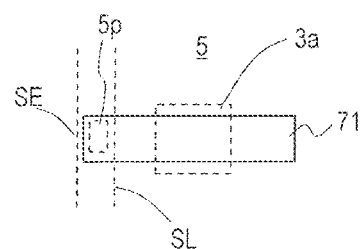
FIG. 7C is a process cross-sectional view illustrating a portion of the terminal section formation region.
Figure 7D:
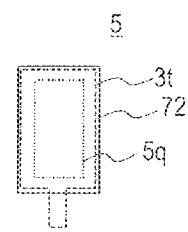
FIG. 7D is a process plan view illustrating a portion of the terminal section formation region.
Figure 8A:
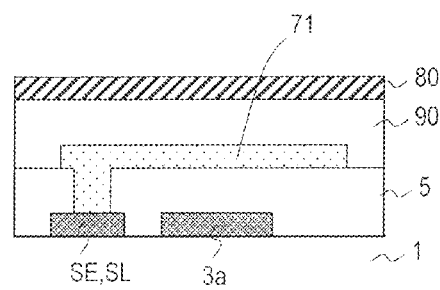
FIG. 8A is a process cross-sectional view illustrating a portion of the pixel area.
Figure 8B:
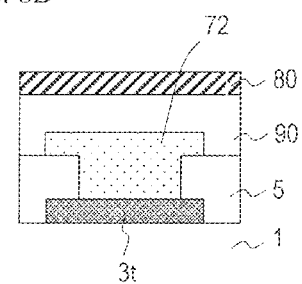
FIG. 8B is a process plan view illustrating a portion of the pixel area.
Figure 8C:
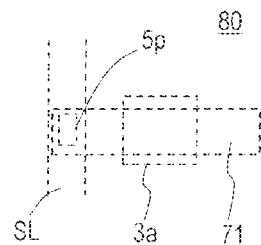
FIG. 8C is a process cross-sectional view illustrating a portion of the terminal section formation region.
Figure 8D:
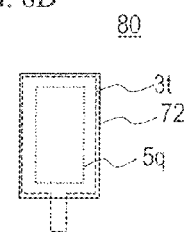
FIG. 8D is a process plan view illustrating a portion of the terminal section formation region.
Figure 9A:
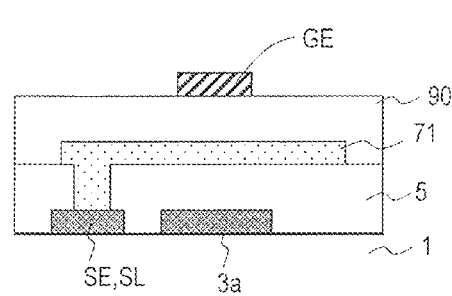
FIG. 9A is a process cross-sectional view illustrating a portion of the pixel area.
Figure 9B:
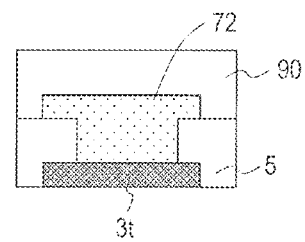
FIG. 9B is a process plan view illustrating a portion of the pixel area.
Figure 9C:
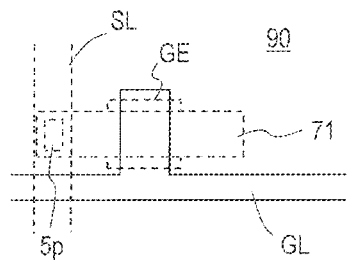
FIG. 9C is a process cross-sectional view illustrating a portion of the terminal section formation region.
Figure 9D:
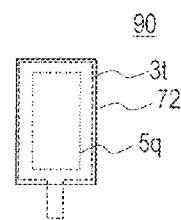
FIG. 9D is a process plan view illustrating a portion of the terminal section formation region.
Figure 10A:
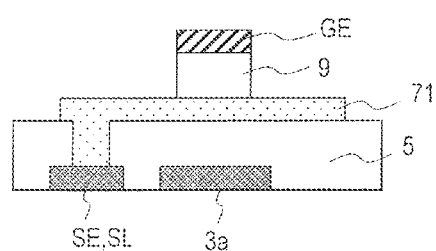
FIG. 10A is a process cross-sectional view illustrating a portion of the pixel area.
Figure 10B:
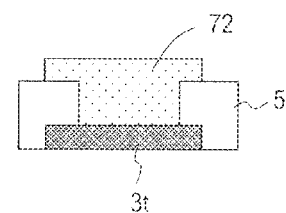
FIG. 10B is a process plan view illustrating a portion of the pixel area.
Figure 10C:
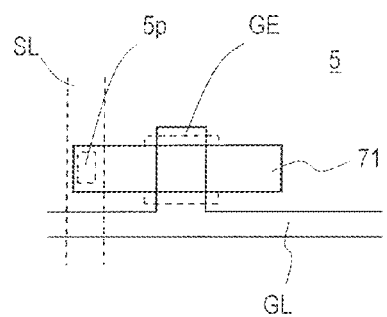
FIG. 10C is a process cross-sectional view illustrating a portion of the terminal section formation region.
Figure 10D:
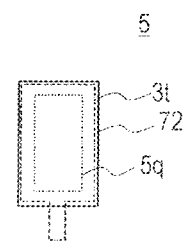
FIG. 10D is a process plan view illustrating a portion of the terminal section formation region.
Figure 11A:
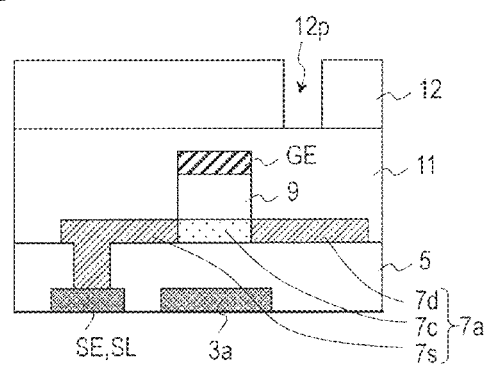
FIG. 11A is a process cross-sectional view illustrating a portion of the pixel area.
Figure 11B:
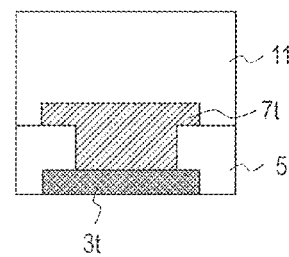
FIG. 11B is a process plan view illustrating a portion of the pixel area.
Figure 11C:
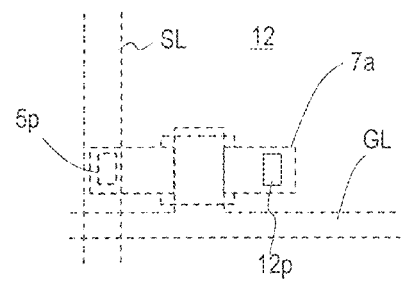
FIG. 11C is a process cross-sectional view illustrating a portion of the terminal section formation region.
Figure 11D:
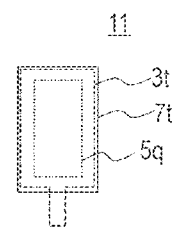
FIG. 11D is a process plan view illustrating a portion of the terminal section formation region.
Figure 12A:
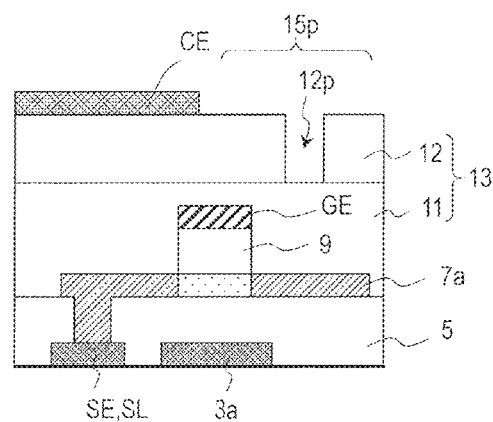
FIG. 12A is a process cross-sectional view illustrating a portion of the pixel area.
Figure 12B:
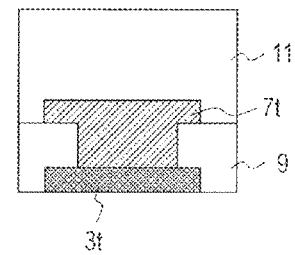
FIG. 12B is a process plan view illustrating a portion of the pixel area.
Figure 12C:
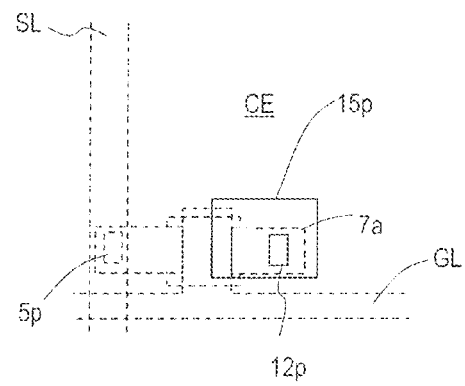
FIG. 12C is a process cross-sectional view illustrating a portion of the terminal section formation region.
Figure 12D:
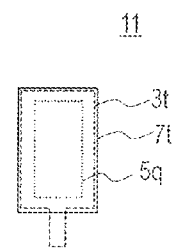
FIG. 12D is a process plan view illustrating a portion of the terminal section formation region.
Figure 13A:
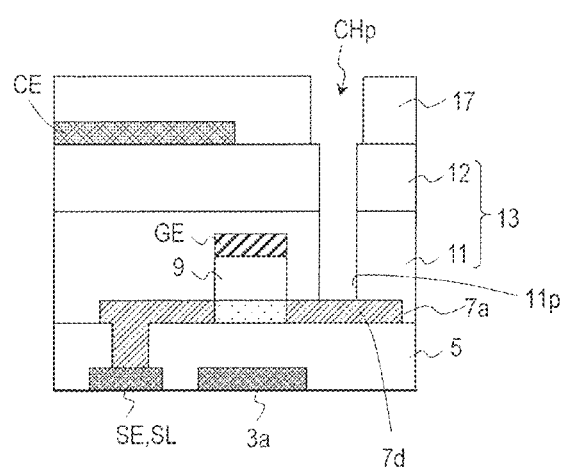
FIG. 13A is a process cross-sectional view illustrating a portion of the pixel area.
Figure 13B:
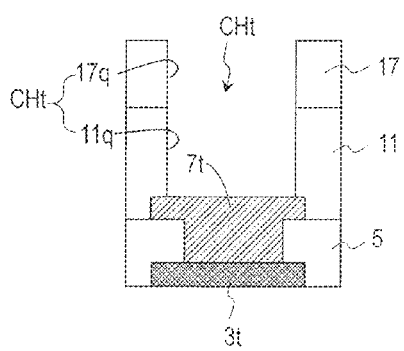
FIG. 13B is a process plan view illustrating a portion of the pixel area.
Figure 13C:
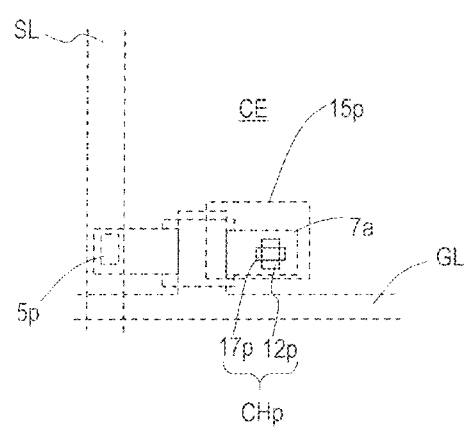
FIG. 13C is a process cross-sectional view illustrating a portion of the terminal section formation region.
Figure 13D:
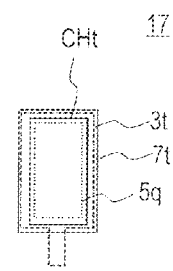
FIG. 13D is a process plan view illustrating a portion of the terminal section formation region.
Figure 14A:
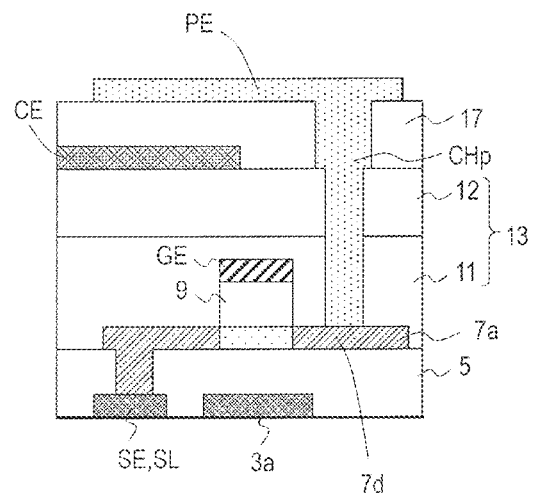
FIG. 14A is a process cross-sectional view illustrating a portion of the pixel area.
Figure 14B:
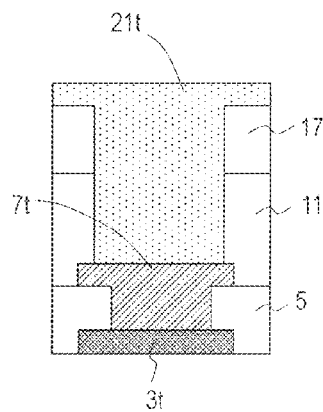
FIG. 14B is a process plan view illustrating a portion of the pixel area.
Figure 14C:
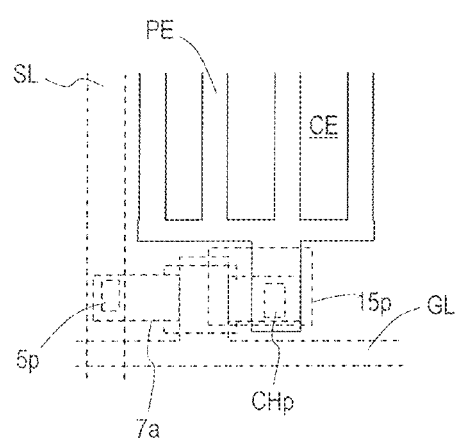
FIG. 14C is a process cross-sectional view illustrating a portion of the terminal section formation region.
Figure 14D:
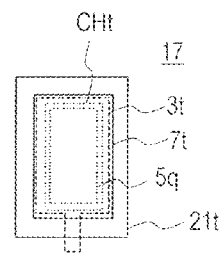
FIG. 14D is a process plan view illustrating a portion of the terminal section formation region.

FIG. 5A to FIG. 5D are process drawings for illustrating the manufacturing method of the active matrix substrate 100. FIGS. 5A and 5B are a process cross-sectional view and a process plan view illustrating a portion of the pixel area P, respectively. FIGS. 5C and 5D are a process cross-sectional view and a process plan view illustrating a portion of the terminal section formation region, respectively. FIG. 6A to FIG. 6D and subsequent drawings also illustrate process cross-sectional views and process plan views of the pixel area P and the terminal section formation region. Here, a method for manufacturing the terminal section T as a wiring line connection section is illustrated. Although not illustrated, a manufacturing method of the source-gate connection section SG (FIG. 4) will be described as appropriate.

STEP1: Forming source metal layer M1 (FIG. 5A to FIG. 5D) A first conductive film (having a thickness of 50 nm to 500 nm, for example) is formed on the substrate 1 by sputtering. Next, the first conductive film is patterned by a known photolithography process. This forms, as illustrated in FIG. 5A to FIG. 5D, the source metal layer M1 which includes the source bus lines SL, the source electrode SE of the TFT 10, the light blocking layer 3a of the TFT 10, the first lower conductive portion 3t, the source connection wiring line 3w, and the second lower conductive portion 3sg (not illustrated).

A transparent and insulating substrate such as a glass substrate, a silicon substrate, a plastic substrate (resin substrate) having heat resistance, or the like can be used as the substrate 1, for example.

The material of the first conductive film is not particularly limited, and for example, a film containing a metal such as aluminum (Al), tungsten (W), molybdenum (Mo), tantalum (Ta), chromium (Cr), titanium (Ti), and copper (Cu), an alloy thereof, or a metal nitride thereof can be appropriately used. Furthermore, a layered film formed by layering these multiple films may be used. Here, as the first conductive film, a layered film (Cu/Ti film) is used which includes a Ti film (having a thickness of 30 nm) and a Cu film (having a thickness of 200 nm) in this order from the substrate 1 side. A layered film (Al/Ti film) including a Ti film and an Al film in this order may be used. In a case where such a layered film is used, as described above, the electrodes and wiring lines having a favorable tapered shape can be formed by wet etching one time.

Alternatively, the first conductive film may be a single layer film or a layered film including a metal oxide film such as an In—Zn—O film, an In—Ga—Zn—O film, or the like.

STEP2: Forming lower insulating layer 5 (FIG. 6A to FIG. 6D) Next, as illustrated in FIG. 6A to FIG. 6D, the lower insulating layer 5 (having a thickness from 200 nm to 600 nm, for example) is formed to cover the source metal layer M1.

The lower insulating layer 5 is formed by CVD, for example. As the lower insulating layer 5, a silicon oxide (SiOx) layer, a silicon nitride (SiNx) layer, a silicon oxynitride (SiOxNy; x>y) layer, a silicon nitride oxide (SiNxOy; x>y) layer, or the like may be used as appropriate. The lower insulating layer 5 may be a single layer or may include a layered structure. For example, a silicon nitride (SiNx) layer, a silicon nitride oxide layer, or the like may be formed on a substrate side (lower layer) in order to prevent diffusion of impurities and the like from the substrate 1, and a silicon oxide (SiO$_2$) layer, a silicon oxynitride layer, or the like may be formed on a layer (upper layer) on the former layer in order to ensure insulating properties. Here, a silicon dioxide (SiO$_2$) layer (having a thickness of 350 nm, for example) is formed as the lower insulating layer 5 by CVD, for example. Alternatively, a layered film having a silicon nitride (SiNx) layer (having a thickness from 50 to 600 nm) as a lower layer and a silicon oxide (SiO$_2$) layer (having a thickness from 50 to 600 nm) as an upper layer may be formed as the lower insulating layer 5. In a case where the oxide film such as a silicon oxide film or the like is used as the lower insulating layer 5 (or, the top layer of the lower insulating layer 5, in a case where the lower insulating layer 5 has a layered structure), oxidation defects generated in the channel region of the oxide semiconductor layer that is subsequently formed can be reduced by the oxide film, and thus, the channel region being reduced to be low-resistive can be suppressed.

Next, the lower insulating layer 5 is patterned by a known photolithography process. As a result, the source opening 5p exposing a portion of the source electrode SE is formed in the pixel area P, and the first lower opening 5q exposing a portion of the first lower conductive portion 3t and the second lower opening 5r (not illustrated) exposing a portion of the second lower conductive portion 3sg are formed in the terminal section formation region.

STEP3: Forming metal oxide layer OS (FIG. 7A to FIG. 7D) Subsequently, an oxide semiconductor film is formed on the lower insulating layer 5. After that, annealing treatment may be performed on the oxide semiconductor film. A thickness of the oxide semiconductor film may be from 15 nm to 200 nm, for example. In a case where the thickness is equal to or more than 15 nm, the surface of the source metal layer M1 exposed by the first lower opening 5q and second lower opening 5r (not illustrated) of the lower insulating layer 5 can be more reliably protected.

Next, the oxide semiconductor film is patterned by a known photolithography process. This forms, as illustrated in FIG. 7A to FIG. 7D, a first semiconductor section 71 serving as an active layer of the TFT 10, a second semiconductor section 72 serving as an oxide connection layer of the terminal section T, and a third semiconductor section (not illustrated) serving as an oxide connection layer of the source-gate connection section SG. The first semiconductor section 71, the second semiconductor section 72, and the third semiconductor section are separate from each other.

In this example, the first semiconductor section 71 is in direct contact with the source electrode SE within the source opening 5p. Similarly, the second semiconductor section 72 is in direct contact with the first lower conductive portion 3t within the first lower opening 5q. Although not illustrated, the third semiconductor section is in directly contact with the second lower conductive portion 3sg within the second lower opening 5r. The first semiconductor section 71, the second semiconductor section 72, and the third semiconductor section are formed, for example, to cover the entire exposed surface of the source metal layer M1.

The oxide semiconductor film is formed by sputtering, for example. Here, as an oxide semiconductor film, an In—Ga—Zn—O based semiconductor film (having a thickness of 50 nm) film including In, Ga, and Zn is formed.

The oxide semiconductor film is patterned by wet etching using, for example, a PAN based etching solution containing phosphoric acid, nitric acid, and acetic acid. In the present embodiment, the second semiconductor section 72 is formed on the surface of the source metal layer M1 exposed by the first lower opening 5q, so the surface of the source metal layer M1 does not contact the PAN based etching solution.

Therefore, elution of the material of the source metal layer M1 can be suppressed. In addition, the damage to the first semiconductor section 71 due to the etching solution including the eluted material (Cu) can be suppressed.

The patterning method of the oxide semiconductor film is not limited to the above-described method. For example, other etching solutions such as oxalic acid-based etching solutions may be used for patterning.

STEP 4: Forming insulating film 90 and second conductive film 80 (FIG. 8A to FIG. 8D)

Next, as illustrated in FIG. 8A to FIG. 8D, an insulating film 90 (having a thickness from 80 nm to 250 nm, for example) serving as a gate insulating layer and a second conductive film 80 (having a thickness from 50 nm to 500 nm, for example) are deposited in this order to cover the metal oxide layer OS.

As the insulating film 90, an insulating film similar to the lower insulating layer 5 (an insulating film exemplified as the lower insulating layer 5) can be used. Here, as the insulating film 90, a silicon oxide ($SiO_2$) layer is formed. In a case where an oxide film such as a silicon oxide film is used as the insulating film, oxidation defects generated in the channel region of the oxide semiconductor layer 7a can be reduced by the oxide film, oxidation defects generated in the channel region of the oxide semiconductor layer 7a can be reduced by the oxide film, and thus, the channel region being reduced to be low-resistive can be suppressed.

As the second conductive film 80, a metal such as molybdenum (Mo), tungsten (W), aluminum (Al), copper (Cu), titanium (Ti), and tantalum (Ta), or an alloy thereof can be used, for example. The second conductive film 80 may have a layered structure including a plurality of layers formed from different conductive materials.

STEP 5: Forming gate metal layer M2 (FIG. 9A to FIG. 9D) Next, the second conductive film 80 is patterned by a known photolithography process to form the gate metal layer M2 including the gate bus line GL, the gate electrode GE, the gate conductive portion 8sg of the source-gate connection section SG (not illustrated), and the like. Here, a resist layer (not illustrated) may be formed on the second conductive film 80, and the second conductive film 80 may be patterned by wet etching using the resist layer as a mask, for example.

STEP 6: Forming gate insulating layer 9 (FIG. 10A to FIG. 10D) After that, as illustrated in FIG. 10A to FIG. 10D, the insulating film 90 is patterned to obtain the gate insulating layer 9. The gate insulating layer 9 may cover only a portion of the first semiconductor section and do not cover the second semiconductor section.

The insulating film 90 may be patterned using the resist layer as a mask used to pattern the second conductive film 80, for example. Alternatively, after removing the resist layer, the insulating film 90 may be patterned using the gate metal layer M2 as a mask. The insulating film 90 can be patterned, for example, by dry etching. This allows the gate insulating layer 9 having substantially the same shape as the gate metal layer M2 to be obtained.

In this process, the patterning of the insulating film 90 and the upper second conductive film is performed using the same mask, so the side surface of the gate insulating layer 9 and the side surface of the gate metal layer M2 such as the gate bus line GL are aligned in the thickness direction. In other words, when viewed from the normal direction of the main surface of the substrate 1, a periphery edge of the gate insulating layer 9 is aligned with a peripheral edge of the gate metal layer M2.

The patterning of the insulating film 90 exposes portions of the first semiconductor section 71 except for those overlapping the gate electrode GE when viewed from the normal direction of the substrate 1. In the terminal section formation region, the entire second semiconductor section 72 is exposed. Although not illustrated, portions of the third semiconductor section is exposed except for those overlapping the gate conductive portion 8sg when viewed from the normal direction of the substrate 1.

STEP 7: Forming protective insulating layer 11 and organic insulating layer 12 (FIG. 11A to FIG. 11D) Next, as illustrated in FIG. 11A to FIG. 11D, the upper insulating layer 13 is formed to cover the gate metal layer M2. Here, as the upper insulating layer 13, the protective insulating layer 11 (having a thickness from 100 nm to 500 nm, for example) and the organic insulating layer 12 (having a thickness from 1 to 3 μm, preferably from 2 to 3 μm, for example) are formed in this order. Note that the organic insulating layer 12 may not be formed.

The protective insulating layer 11 may be an insulating layer that can reduce the oxide semiconductor (for example, a layer having hydrogen-donating properties such as a silicon nitride layer), or may have a layered structure with such an insulating layer as the bottom layer. Here, a SiNx layer (having a thickness of 300 nm), for example, is formed as the protective insulating layer 11 by CVD.

For example, by disposing the layer having hydrogen-donating properties such as a silicon nitride layer to be in contact with the exposed surface of the first semiconductor section 71, the second semiconductor section 72, and the third semiconductor section, portions of these semiconductor sections that contact the silicon nitride layer are reduced to serve as lower-resistance regions lower in the specific resistances than the portion covered with the gate insulating layer 9. The portion covered with the gate insulating layer 9 remains as the semiconductor region. As a result, the first semiconductor section 71 serves as the oxide semiconductor layer 7a including the channel region 7c, and the first region 7s and the second region 7d which are the low-resistance regions. The second semiconductor section 72 serves as the first oxide connection layer 7t including a low-resistance region. Although not illustrated, the third semiconductor section serves as the second oxide connection layer 7sg including the first portion s1 which is a semiconductor region and the second portion s2 that is a low-resistance region. The low-resistance region may be a conductive region (e.g., sheet resistance of 200Ω/☐ or less).

Note that the material of the protective insulating layer 11 is not limited to the above. The protective insulating layer 11 may be a silicon oxide (SiOx) layer, a silicon nitride (SiNx) layer, or a silicon oxynitride (SiNxOy) layer.

The method of forming the low-resistance region is also not limited to the above. For example, a low-resistance treatment such as a plasma treatment may be performed on the exposed surfaces of the first semiconductor section 71, the second semiconductor section 72, and the third semiconductor section before forming the protective insulating layer 11 to form the low-resistance region. The low-resistance treatment (for example, plasma treatment) allows regions of these semiconductor sections that do not overlap the gate metal layer M2 and the gate insulating layer 9 to serve as the low-resistance regions lower in the specific resistances than regions overlapping these semiconductor sections when viewed from the normal direction of the substrate 1.

In the low-resistance treatment (plasma treatment), the portions of the first semiconductor section 71, the second semiconductor section 72, and the third semiconductor section not covered with the gate bus line GL or the gate insulating layer 9 may be exposed to a plasma containing a reductive plasma or doping element (for example, argon plasma). The methods and conditions of the low-resistance treatment are described in JP 2008-40343 A, for example. The entire contents of the disclosure of JP 2008-40343 A are incorporated herein as reference.

The organic insulating layer 12 may be, for example, an organic insulating film containing a photosensitive resin material (for example, an acrylic resin film). Next, the organic insulating layer 12 is patterned. This forms the opening 12*p* in the organic insulating layer 12 in each of the pixel areas P. The opening 12*p* is disposed to overlap the second region 7*d* when viewed from the normal direction of the substrate 1. In addition, portions of the organic insulating layer 12 located in the terminal section formation region and the source-gate connection section formation region may be removed. The entire portion of the organic insulating layer 12 located in the non-display region may be removed.

STEP 8: Forming common electrode layer TC (FIG. 12A to FIG. 12D)

Subsequently, as illustrated in FIG. 12A to FIG. 12D, the common electrode layer TC including the common electrode CE is formed on the upper insulating layer 13.

First, the second transparent conductive film (having a thickness from 20 to 300 nm) is formed on the upper insulating layer 13 and within the opening 12*p*. Here, an indium-zinc oxide film is formed as the second transparent conductive film by sputtering, for example. Metal oxide such as ITO (indium-tin oxide), indium-zinc oxide, or ZnO may be used for material of the second transparent conductive film. After that, the first transparent conductive film is patterned. In the patterning, wet etching may be performed using an oxalic acid-based etching solution, for example. This allows the common electrode CE to be obtained. In this example, the common electrode CE includes the opening 15*p* in a pixel contact hole formation region where the pixel contact hole CHp is formed. In addition to the pixel contact hole formation region, the common electrode CE may be disposed across substantially the entire display region.

STEP 9: Forming dielectric layer 17 (FIG. 13A to FIG. 13D) Next, as illustrated in FIG. 13A to FIG. 13D, the dielectric layer 17 (having a thickness from 50 to 500 nm) is formed to cover the common electrode layer TC, and the dielectric layer 17 and the protective insulating layer 11 are patterned.

The dielectric layer 17 is formed on the organic insulating layer 12 and the common electrode CE and within the opening 12*p* in the pixel area P. In the terminal section formation region and the source-gate connection section formation region, the dielectric layer 17 is formed on the protective insulating layer 11. The material of the dielectric layer 17 may be the same as the material described as the material of the protective insulating layer 11. Here, as the dielectric layer 17, a SiN film is formed by CVD, for example.

After that, a resist layer (not illustrated) is formed on the dielectric layer 17 by the photolithography process. The dielectric layer 17 and the protective insulating layer 11 are etched using the resist layer and the organic insulating layer 12 as a mask. The dielectric layer 17 and the protective insulating layer 11 may be etched in the same etching process. This forms the pixel contact hole CHp that exposes a portion of the second region 7*d* of the oxide semiconductor layer 7*a* in the pixel area P. The pixel contact hole CHp is constituted by the opening 11*p* formed in the protective insulating layer 11, the opening 12*p* in the organic insulating layer 12, and the opening 17*p* in the dielectric layer 17. In this example, because the organic insulating layer 12 functions as a mask for the protective insulating layer 11, the side surface of the opening 11*p* is aligned with the side surface of the opening 12*p*. The opening 17*p* may overlap at least partially the opening 12*p* when viewed from the normal direction of the substrate 1. In the terminal section formation region, the dielectric layer 17 and the protective insulating layer 11 are simultaneously etched to form the terminal section contact hole CHt exposing a portion of the first oxide connection layer 7*t*. The terminal section contact hole CHt is constituted by the opening 11*q* and the opening 17*q*. A side surface of the opening 11*q* and a side surface of the opening 17*q* may be aligned with each other. Although not illustrated, in the source-gate connection section formation region also, the SG contact hole CHsg constituted by the opening 11*r* and the opening 17*r* is formed in the dielectric layer 17 and the protective insulating layer 11. A side surface of the opening 11*r* and a side surface of the opening 17*r* may be aligned with each other.

STEP 10: Forming pixel electrode layer TP (FIG. 14A to FIG. 14D)

Next, the pixel electrode layer TP including the pixel electrode PE is formed.

First, the first transparent conductive film (having a thickness of 20 to 300 nm) is formed on the dielectric layer 17, within the pixel contact hole CHp, within the terminal section contact hole CHt, and within the SG contact hole CHsg. The material of the first transparent conductive film may be the same as the material described as the material of the second transparent conductive film.

After that, the first transparent conductive film is patterned. The first transparent conductive film may be wet-etched using an oxalic acid-based etching solution, for example. This forms, as illustrated in FIG. 14A to FIG. 14D, the pixel electrode PE, the first upper conductive portion 21*t*, and the second upper conductive portion 21*sg* (not illustrated). The pixel electrode PE is formed on the dielectric layer 17 and within the pixel contact hole CHp in the pixel area P, and is in contact with the second region 7*d* within the pixel contact hole CHp. The first upper conductive portion 21*t* is formed on the dielectric layer 17 and within the terminal section contact hole CHt in the terminal section formation region, and is in contact with the first oxide connection layer 7*t* within the terminal section contact hole CHt. Although not illustrated, the second upper conductive portion 21*sg* is formed on the dielectric layer 17 and within the SG contact hole CHsg in the source-gate connection formation region, and is in contact with the second oxide connection layer 7*sg* and the gate conductive portion 8*sg* within the SG contact hole CHsg. In this manner, the active matrix substrate 100 is manufactured.

According to the method described above, the wiring line connection section can be manufactured on the substrate 1 without increasing the number of photomasks to be used (here, eight).

Second Embodiment

Hereinafter, an active matrix substrate according to a second embodiment will be described with reference to the drawings. Hereinafter, a difference from the first embodiment will be described mainly, and description of a similar configuration will be omitted.

In the present embodiment, the oxide semiconductor TFT serving as the pixel TFT further includes a lower gate electrode disposed on the substrate side of the oxide semiconductor layer (double gate structure). The lower gate electrode is formed in the source metal layer M1. Furthermore, a wiring line connection section (hereinafter, referred to as a "gate contact section") GC that electrically connects the lower gate electrode to the corresponding gate bus line GL is provided in the display region.

Figure 15A:
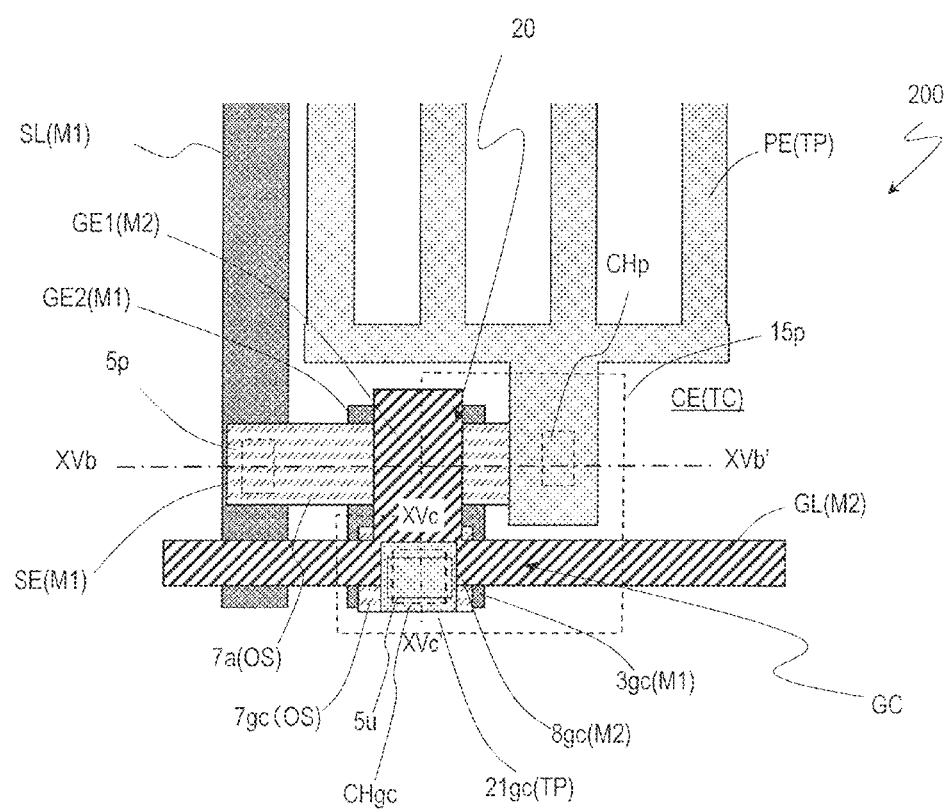
FIG. 15A is a plan view illustrating a pixel area in an active matrix substrate 200 according to a second embodiment.

FIG. 15A is a plan view illustrating a pixel area P in an active matrix substrate 200 according to a second embodiment; A TFT 20, the pixel electrode PE, and a gate contact section GC of the TFT 20 are disposed in association with each pixel area P.

Figure 15B:
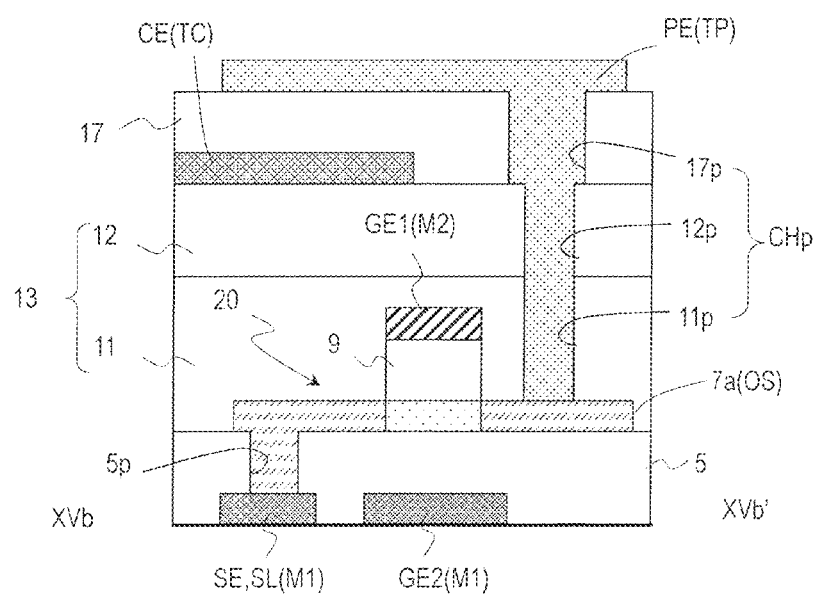
FIG. 15B is a cross-sectional view across a TFT 20 in the pixel area in the active matrix substrate 200.
Figure 15C:
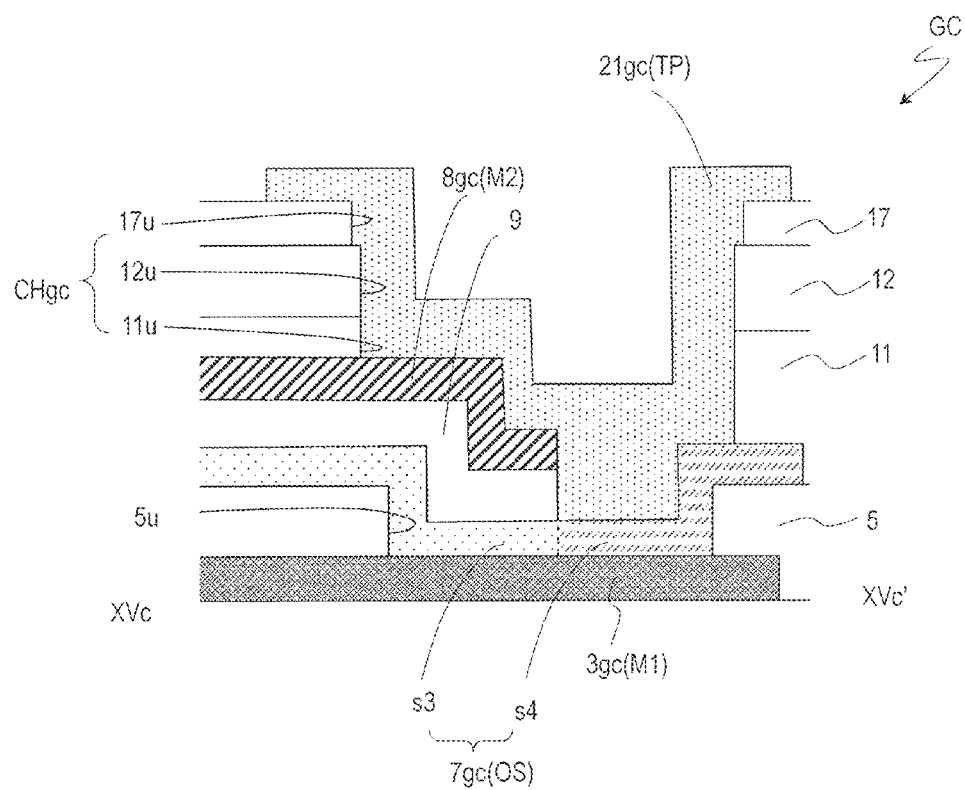
FIG. 15C is a cross-sectional view illustrating a wiring line connection section (gate contact section GC) in the pixel area in the active matrix substrate 200.

FIG. 15B is a cross-sectional view taken along a line XVb-XVb' across the TFT 20. FIG. 15C is a cross-sectional view taken along a line XVc-XVc' across the gate contact section GC. In FIG. 15A to FIG. 15C, the constituent elements the same as the active matrix substrate 100 are denoted by the same reference numerals.

The TFT 20 is a double gate structure TFT including the oxide semiconductor layer 7a, a gate electrode (hereinafter referred to as "upper gate electrode") GE1 disposed over the oxide semiconductor layer 7a with the gate insulating layer 9 interposed therebetween, and a lower gate electrode GE2 disposed closer to the substrate 1 than the oxide semiconductor layer 7a with the lower insulating layer 5 interposed therebetween. The upper gate electrode GE1 is the same as the gate electrode GE according to the first embodiment and is formed in the gate metal layer M2. The lower gate electrode GE2 is formed in the source metal layer M1. The lower gate electrode GE2 is electrically separate from the source bus line SL. The lower gate electrode GE2 overlaps at least the channel region 7c when viewed from the normal direction of the substrate 1, and may function as a light blocking layer.

The gate contact section GC may be disposed near the TFT 20, for example. The gate contact section GC includes a third lower conductive portion 3gc formed in the source metal layer M1 (specifically, using the first conductive film), the lower insulating layer 5 extending over the third lower conductive portion 3gc, a third oxide connection layer 7gc formed in the metal oxide layer OS (specifically, using the oxide semiconductor film), a gate conductive portion 8gc, and a third upper conductive portion 21gc.

The third lower conductive portion 3gc is linked to (integrally formed with) the lower gate electrode GE2. In this example, the third lower conductive portion 3gc is an extending portion extending from the lower gate electrode GE2 toward the gate bus line GL. The third lower conductive portion 3gc may overlap a portion of the gate bus line GL when viewed from the normal direction of the substrate 1.

The lower insulating layer 5 includes a third lower opening 5u exposing a portion of the third lower conductive portion 3gc. The third oxide connection layer 7gc is connected to the third lower conductive portion 3gc within the third lower opening 5u. The third oxide connection layer 7gc may be disposed on the lower insulating layer 5 and within the third lower opening 5u. The third oxide connection layer 7gc is disposed separately (separated) from the oxide semiconductor layer 7a. The third oxide connection layer 7gc may cover the entire surface of the third lower conductive portion 3gc exposed by the third lower opening 5u. The third oxide connection layer 7gc may be in direct contact with the third lower conductive portion 3gc.

The gate insulating layer 9 is disposed on the third oxide connection layer 7gc to cover only a portion (third portion) s3 of the portion exposed by the third lower opening 5u in the third oxide connection layer 7gc. The gate conductive portion 8gc is disposed over the third portion s3 with the gate insulating layer 9 interposed therebetween. An insulating layer (here, the protective insulating layer 11, the organic insulating layer 12, and the dielectric layer 17) extends over the gate conductive portion 8gc and the third oxide connection layer 7gc.

A GC contact hole CHgc (also referred to as a third upper opening) is formed in the insulating layer described above (the protective insulating layer 11, the organic insulating layer 12, and the dielectric layer 17). In this example, the GC contact hole CHgc includes an opening 11u formed in the protective insulating layer 11, an opening 12u formed in the organic insulating layer 12, and an opening 17u formed in the dielectric layer 17. The GC contact hole CHgc is disposed to expose a portion of the gate conductive portion 8gc and at least a portion of a fourth portion s4 of the third oxide connection layer 7gc not covered with the gate insulating layer 9. The third portion s3 of the third oxide connection layer 7gc covered with the gate insulating layer 9 is a semiconductor region, and the fourth portion s4 not covered with the gate insulating layer 9 is a low-resistance region having a specific resistance lower than the third portion s3.

The third upper conductive portion 21gc is disposed on the insulating layer describe above (here, on the dielectric layer 17) and within the GC contact hole CHgc. The third upper conductive portion 21gc is connected to (here, in direct contact with) both a portion of the fourth portion s4 of the third oxide connection layer 7gc and a portion of the gate conductive portion 8gc within the GC contact hole CHgc.

The third upper conductive portion 21gc may be formed in the pixel electrode layer TP or may be formed in another conductive layer. In a case where the third upper conductive portion 21gc is formed in the pixel electrode layer TP, the protective insulating layer 11 and the dielectric layer 17 are collectively patterned to simultaneously form the pixel contact hole CHp and the GC contact hole CHgc advantageously.

In the gate contact section GC according to the present embodiment, the lower gate electrode GE2 of the TFT 20 can be electrically connected to the corresponding gate bus line GL (or the upper gate electrode GE1) with the low-resistance region of the third oxide connection layer 7gc interposed therebetween. Similarly to the wiring line connection section described above, in forming the gate contact section GC, the surface of the source metal layer M1 exposed by the third lower opening 5u of the lower insulating layer 5 (the surface of the third lower conductive portion 3gc) is protected by an oxide semiconductor film serving as the third oxide connection layer 7gc. Accordingly, in the processes such as the etching process of an oxide semiconductor film and the forming process of an insulating layer, damage to the exposed surface of the source metal layer M1 and damage to the oxide semiconductor layer 7a caused by the material of the source metal layer M1 eluting into the etching solution can be suppressed.

The active matrix substrate 200 may further include the terminal section T similar to the embodiment described above (FIGS. 3A and 3B), and/or a plurality of source-gate connection sections SG (FIG. 4).

The active matrix substrate 200 may be manufactured by the same method as the active matrix substrate 100 according to the first embodiment (eight mask processes). The gate contact section GC is manufactured by the same process as the source-gate connection section SG illustrated in FIG. 4. However, because the organic insulating layer 12 extends in the region where the gate contact section GC is formed, the opening 12u is formed in the organic insulating layer 12 in STEP 7, and the openings 17u and 11u are formed in the dielectric layer 17 and the protective insulating layer 11, respectively, in STEP 9 to form the GC contact hole CHgc.

Third Embodiment

Hereinafter, an active matrix substrate according to a third embodiment will be described with reference to the drawings. Hereinafter, a difference from the first embodiment will be described mainly, and description of a similar configuration will be omitted.

In the present embodiment, the oxide semiconductor TFT serving as the pixel TFT is a double gate structure TFT further including a lower gate electrode disposed on the substrate side of the oxide semiconductor layer similarly to the second embodiment. The gate contact section GC that electrically connects the lower gate electrode to the corresponding gate bus line GL is provided in the display region.

Figure 16A:
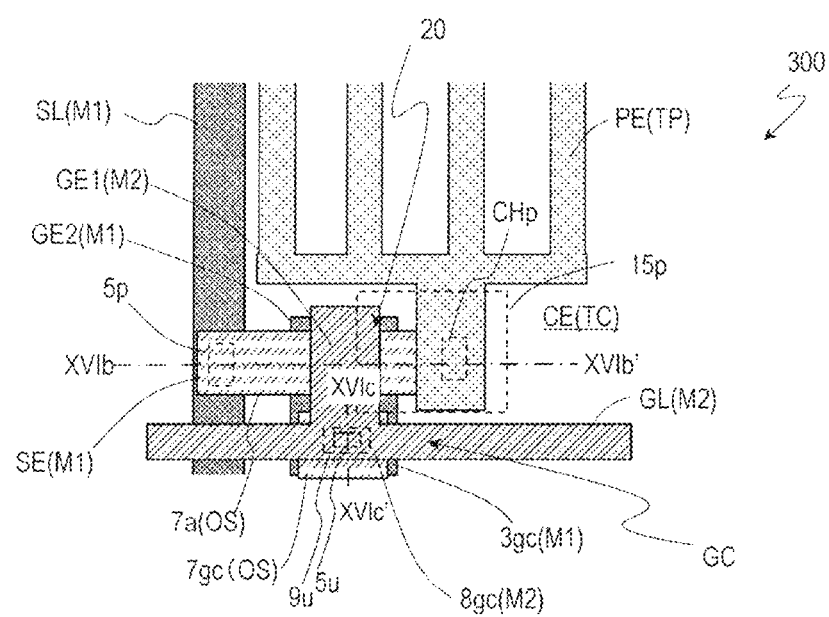
FIG. 16A is a plan view illustrating a pixel area in an active matrix substrate 300 according to a third embodiment.

FIG. 16A is a plan view illustrating a pixel area P in an active matrix substrate 300 according to a third embodiment. The TFT 20, the pixel electrode PE, and the gate contact section GC of the TFT 20 are disposed in association with each pixel area P.

Figure 16B:
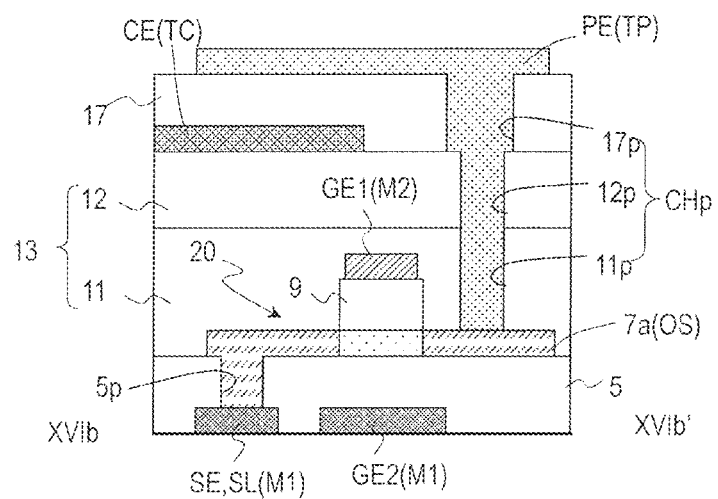
FIG. 16B is a cross-sectional view across a TFT 20 in the pixel area in the active matrix substrate 300.
Figure 16C:
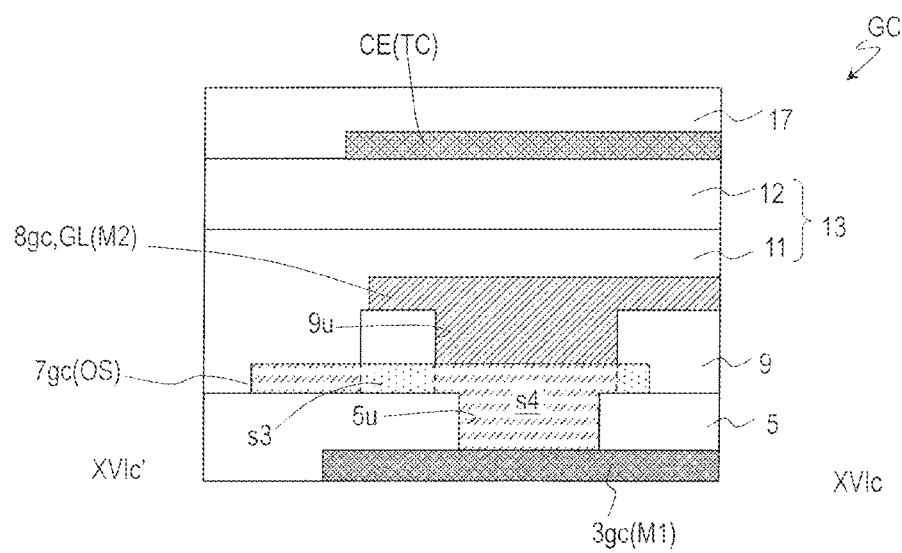
FIG. 16C is a cross-sectional view illustrating a wiring line connection section (gate contact section GC) in the pixel area in the active matrix substrate 300.

FIG. 16B is a cross-sectional view taken along a line XVIb-XVIb' across the TFT 20. FIG. 15C is a cross-sectional view taken along a line XVIc-XVIc' across the gate contact section GC. In FIG. 16A to FIG. 16C, the constituent elements the same as the active matrix substrates 100 and 200 are denoted by the same reference numerals.

The TFT 20 is a double gate structure TFT including the oxide semiconductor layer 7a, the upper gate electrode GE1 disposed over the oxide semiconductor layer 7a with the gate insulating layer 9 interposed therebetween, and the lower gate electrode GE2 disposed closer to the substrate 1 than the oxide semiconductor layer 7a with the lower insulating layer 5 interposed therebetween. The upper gate electrode GE1 is the same as the gate electrode GE according to the first embodiment and is formed in the gate metal layer M2. The lower gate electrode GE2 is formed in the source metal layer M1. The lower gate electrode GE2 is electrically separate from the source bus line SL. The lower gate electrode GE2 overlaps at least the channel region 7c when viewed from the normal direction of the substrate 1, and may function as a light blocking layer.

The gate contact section GC may be disposed near the TFT 20, for example. The gate contact section GC includes the third lower conductive portion 3gc formed in the source metal layer M1 (specifically, using the first conductive film), the lower insulating layer 5 extending over the third lower conductive portion 3gc, the third oxide connection layer 7gc formed in the metal oxide layer OS (specifically, using the oxide semiconductor film), and the gate conductive portion 8gc. In the present embodiment, the conductive portion 8gc corresponds to the "third upper conductive portion".

The third lower conductive portion 3gc is linked to (integrally formed with) the lower gate electrode GE2. In this example, the third lower conductive portion 3gc is an extending portion extending from the lower gate electrode GE2 toward the gate bus line GL. The third lower conductive portion 3gc may overlap a portion of the gate bus line GL when viewed from the normal direction of the substrate 1.

The lower insulating layer 5 includes the third lower opening 5u exposing a portion of the third lower conductive portion 3gc. The third oxide connection layer 7gc is connected to the third lower conductive portion 3gc within the third lower opening 5u. The third oxide connection layer 7gc may be disposed on the lower insulating layer 5 and within the third lower opening 5u. The third oxide connection layer 7gc is disposed separately (separated) from the oxide semiconductor layer 7a. The third oxide connection layer 7gc may cover the entire surface of the third lower conductive portion 3gc exposed by the third lower opening 5u. The third oxide connection layer 7gc may be in direct contact with the third lower conductive portion 3gc.

The gate insulating layer 9 extends over the third oxide connection layer 7gc. The gate insulating layer 9 includes a third upper opening 9u exposing a portion of the third upper conductive portion 8gc. When viewed from the normal direction of the substrate 1, the third upper opening 9u may at least partially overlap the first lower opening 5q.

The portion (fourth portion) s4 of the third oxide connection layer 7gc not covered with the gate insulating layer 9 is a low-resistance region having a specific resistance lower than the channel region 7c. The portion (third portion) s3 of the third oxide connection layer 7gc covered with the gate insulating layer 9 may be a semiconductor region.

The third upper conductive portion 8gc is disposed on the gate insulating layer 9 and within the third upper opening 9u, and is connected to the low-resistance region (fourth portion s4) of the third oxide connection layer 7gc within the third upper opening 9u. Specifically, the third upper conductive portion 8gc is electrically connected to the third lower conductive portion 3gc with the third oxide connection layer 7gc interposed therebetween. The third upper conductive portion 8gc may be in direct contact with the third oxide connection layer 7gc.

The third upper conductive portion 8gc is formed in the gate metal layer M2 and is electrically connected to the upper gate electrode GE1 and the corresponding gate bus line GL. The third upper conductive portion 8gc may be linked to the upper gate electrode GE1. The third upper conductive portion 8gc may be a portion of the gate bus line GL, or may be formed on an extending portion or protrusion (branch portion) of the gate bus line GL. In this example, the third upper conductive portion 8gc is a portion of the gate bus line GL.

The upper insulating layer 13 including the protective insulating layer 11 extends over the third upper conductive portion 8gc, for example. The dielectric layer 17 and the common electrode CE may be disposed on the upper insulating layer 13.

In the gate contact section GC according to the present embodiment, the lower gate electrode GE2 of the TFT 20 can be electrically connected to the corresponding gate bus line GL (or the upper gate electrode GE1) with the low-resistance region of the third oxide connection layer 7gc interposed therebetween. Similarly to the wiring line connection section described above, in forming the gate contact section GC, the surface of the source metal layer M1 exposed by the third lower opening 5u of the lower insulating layer 5 (the surface of the third lower conductive portion 3gc) is protected by an oxide semiconductor film serving as the third oxide connection layer 7gc. Accordingly, in the processes such as the etching process of an oxide semiconductor film and the forming process of an insulating layer, damage to the exposed surface of the source metal layer M1 and damage to the oxide semiconductor layer 7a caused by the material of the source metal layer M1 eluting into the etching solution can be suppressed.

Figure 16D:
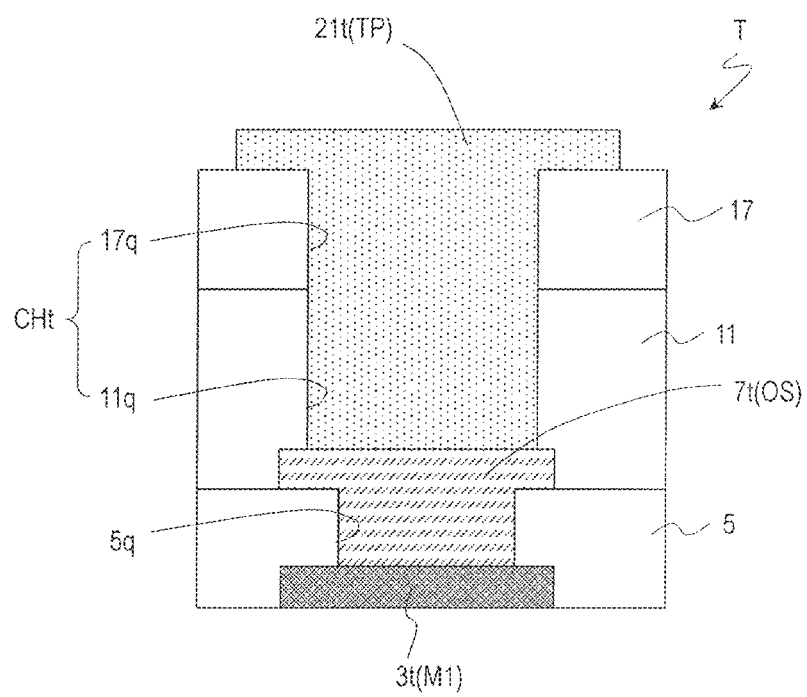
FIG. 16D is a cross-sectional view illustrating another wiring line connection section (terminal section T) in the active matrix substrate 300.
Figure 16E:
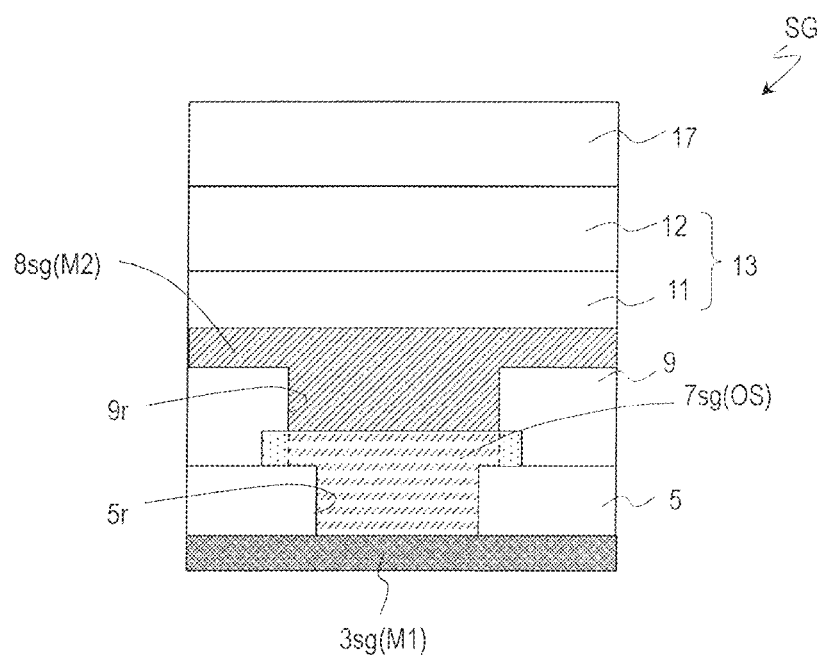
FIG. 16E is a cross-sectional view illustrating another wiring line connection section (source-gate connection section SG) in the active matrix substrate 300.

The active matrix substrate 300 may further include a plurality of terminal sections T disposed in the non-display region, and/or a plurality of source-gate connection sections SG. The terminal section T may have a configuration the same as that of the embodiments described above, as illustrated in FIG. 16D. In the source-gate connection section SG, as illustrated in FIG. 16E, a lower opening 9r may be formed in the gate insulating layer 9, and the conductive portion 8sg in the gate metal layer M2 (corresponding to the second upper conductive portion) may be contacted to the second oxide connection layer 7sg within the lower opening 9r. In this way, the active matrix substrate 300 may include both the wiring line connection sections (terminal sections T and/or source-gate connection sections SG) disposed in the non-display region and the wiring line connection sections (gate contact sections GC) disposed in the display region.

The active matrix substrate 300 may be manufactured by the same method as the active matrix substrate 100 according to the first embodiment. However, the gate insulating layer 9 and the gate metal layer M2 are patterned separately using different photomasks. Therefore, the number of photomasks used increases (nine in this case).

Specifically, after forming the insulating film 90 serving as the gate insulating layer 9 in STEP 4, a first resist layer is formed on the insulating film 90 by a photolithography process, and the formed first resist layer is used as a mask to form the gate insulating layer 9. After that, the portion of the oxide semiconductor film not covered with the gate insulating layer 9 is subjected to the low-resistance treatment. Subsequently, the second conductive film covering the gate insulating layer 9 is formed. Next, a second resist layer is formed on the second conductive film using a photomask different from that of the insulating film 90, and the formed second resist layer is used as a mask to pattern the second conductive film 80 to form the gate metal layer M2. In this case, when viewed from the normal direction of the substrate 1, a periphery edges of the gate bus line GL and the upper gate electrode GE1 in the gate metal layer M2 may be positioned inside the periphery edge of the gate insulating layer 9.

Alternatively, after forming the insulating film 90 in STEP 4, a first photomask is used to pattern the insulating film 90 (first patterning) to form, in the insulating film 90, a third upper opening 9u exposing a portion of the semiconductor section serving as the third oxide connection layer 7gc. After that, the exposed surface of the semiconductor section is subjected to the low-resistance treatment. Next, after the second conductive film 80 is formed, a second photomask different from the first photomask is used to patter the second conductive film 80 and the insulating film 90 (second patterning) in the same method as in STEP 5. In the second patterning, the second conductive film 80 and the insulating film 90 are etched using the same second photomask, and thus, the side surfaces of the gate bus line GL, the upper gate electrode GE1, and the like are aligned with the side surface of the gate insulating layer 9. After forming the gate metal layer M2, the first semiconductor section or the like may be subjected to the low-resistance treatment.

MODIFIED EXAMPLE

Hereinafter, a modified example of the active matrix substrate will be described. The following description mainly describes differences from the active matrix substrate 100. Constituent elements the same as the active matrix substrate 100 are denoted by the same reference numerals, and the description thereof is adequately omitted. Materials, forming processes, and the like of each constituent element may be the same as described above.

Modified Example 1

Figure 17A:
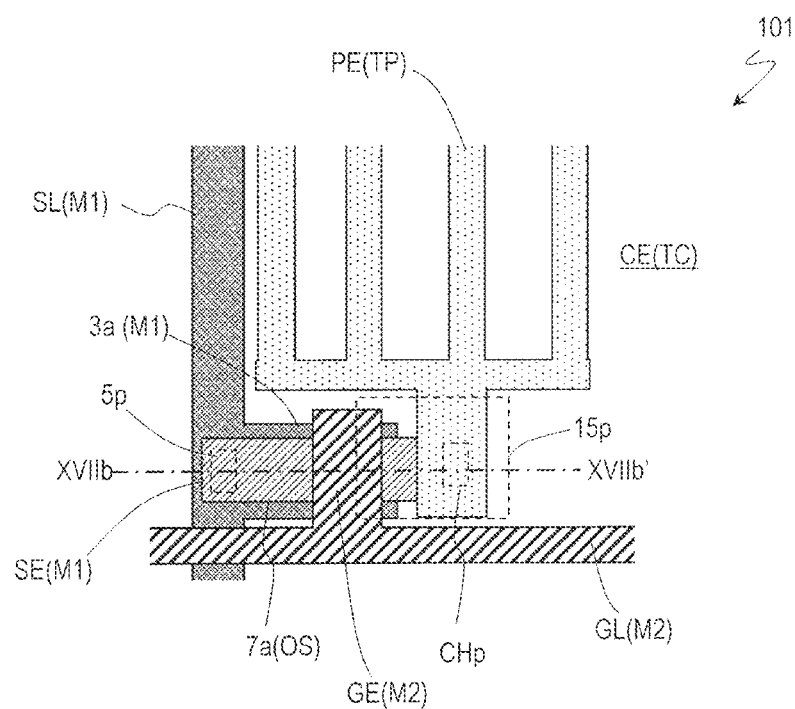
FIG. 17A is a plan view illustrating a pixel area in an active matrix substrate 101 according to Modified Example 1.
Figure 17B:
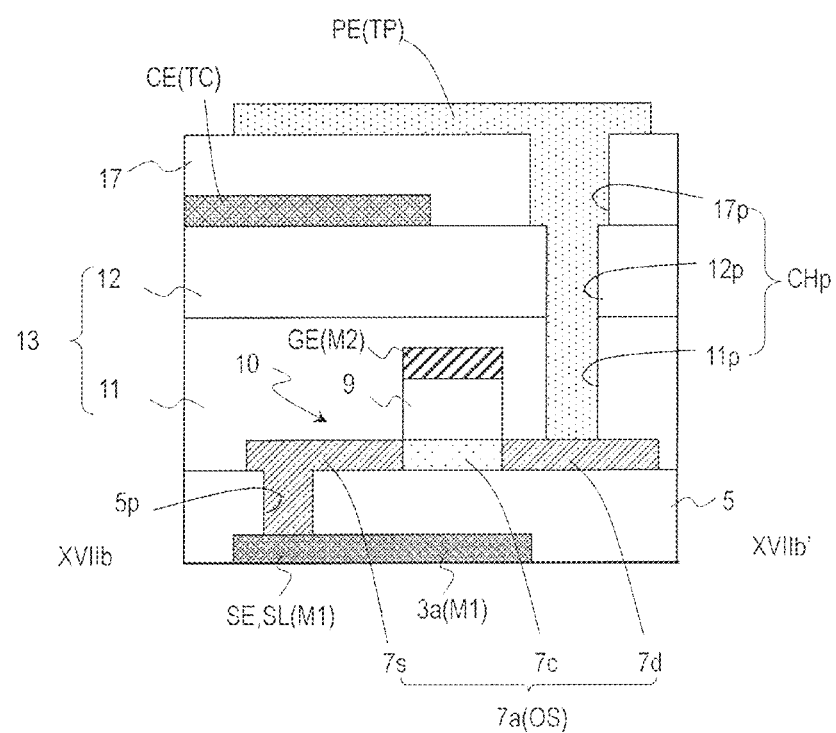
FIG. 17B is a cross-sectional view illustrating the pixel area in the active matrix substrate 101 according to Modified Example 1.

FIG. 17A is a plan view illustrating a pixel area P in an active matrix substrate 101 according to Modified Example 1. FIG. 17B is a cross-sectional view taken along a line XVIIb-XVIIb' across a TFT 10 according to Modified Example 1.

In Modified Example 1, a light blocking layer 3a is integrally formed with the source electrode SE. In this example, the source bus line SL includes a main portion extending in a first direction and a branch portion extending from a portion of a side surface of the main portion in a second direction when viewed from the normal direction of the substrate 1. The branch portion extends to overlap the oxide semiconductor layer 7a, and a portion overlapping the oxide semiconductor layer 7a functions as the light blocking layer 3a. A portion of the branch portion connected to the first region 7s functions as the source electrode SE. According to Modified Example 1, design may be made without consideration for a space between the light blocking layer 3a and the source electrode SE (or the source bus line SL). For this reason, there is an advantage that an aperture ratio can be further improved, particularly in high definition display devices.

Modified Example 2

Figure 18A:
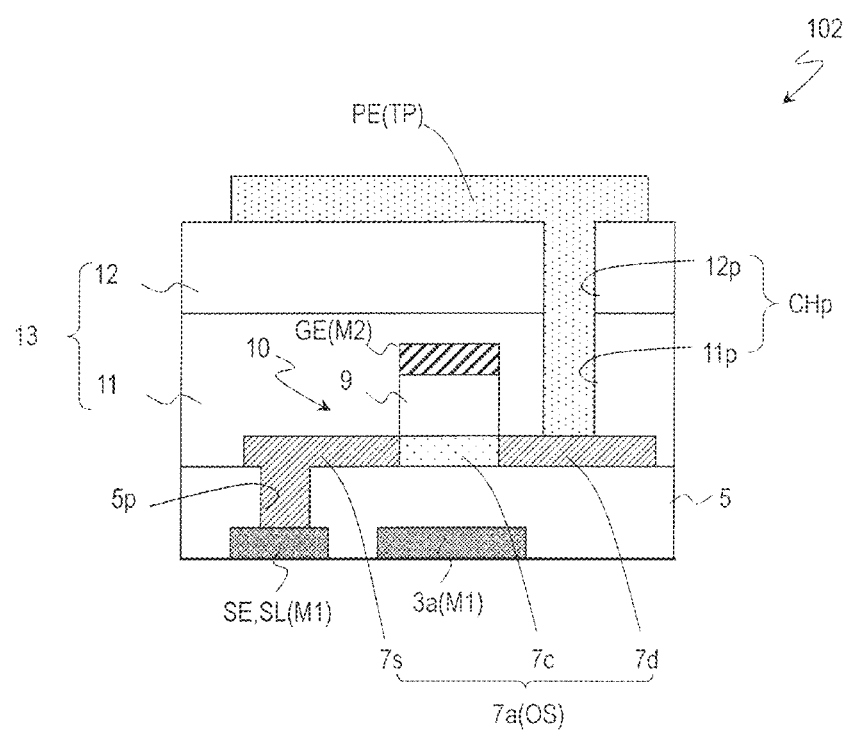
FIG. 18A is a cross-sectional view illustrating a pixel area in an active matrix substrate 102 according to Modified Example 2.
Figure 18B:
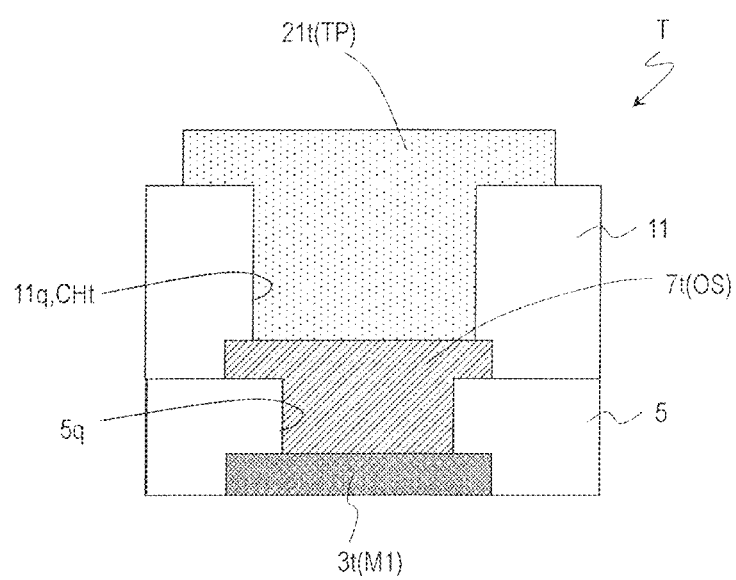
FIG. 18B is a cross-sectional view illustrating a wiring line connection section (terminal section T) in the active matrix substrate 102 according to Modified Example 2.

FIGS. 18A and 18B are cross-sectional views illustrating a pixel area P and a terminal section T, respectively, in an active matrix substrate 102 according to Modified Example 2.

The active matrix substrate according to Modified Example 2 differs from the active matrix substrate 100 described above in that the active matrix substrate does not include the dielectric layer 17 and the common electrode CE.

In Modified Example 2, the pixel electrode PE is disposed on the organic insulating layer 12 and is connected to the second region 7d of the oxide semiconductor layer 7a within the pixel contact holes CHp formed in the protective insulating layer 11 and the organic insulating layer 12. In the terminal section T, the first upper conductive portion 21t is formed on the protective insulating layer 11 using the same conductive film as the pixel electrode PE. The first upper conductive portion 21t is connected to the first oxide connection layer 7t within the opening 11q (terminal section contact hole CHt) formed in the protective insulating layer 11.

The active matrix substrate 102 according to Modified Example 2 is applied to a display device of a vertical electrical field driving method such as a VA mode, for example. In such a display device, the common electrode CE is formed on a counter substrate disposed opposite to the active matrix substrate with a liquid crystal layer interposed therebetween, for example.

The active matrix substrate 102 according to Modified Example 2 may be manufactured by the same method as the active matrix substrate 100. However, after the protective insulating layer 11 and the organic insulating layer 12 are formed, the organic insulating layer 12 and the protective insulating layer 11 are patterned in STEP 8. This forms the pixel contact hole CHp including the opening 11p and the opening 12p in the pixel area P. In the terminal section formation region, the opening 11q exposing a portion of the first oxide connection layer 7t (terminal section contact hole CHt) is formed. After that, the pixel electrode layer TP including the pixel electrode PE, the first upper conductive portion 21t, and the second upper conductive portion 21sg is formed to obtain the active matrix substrate 102 according to Modified Example 2.

Modified Example 3

Figure 19A:
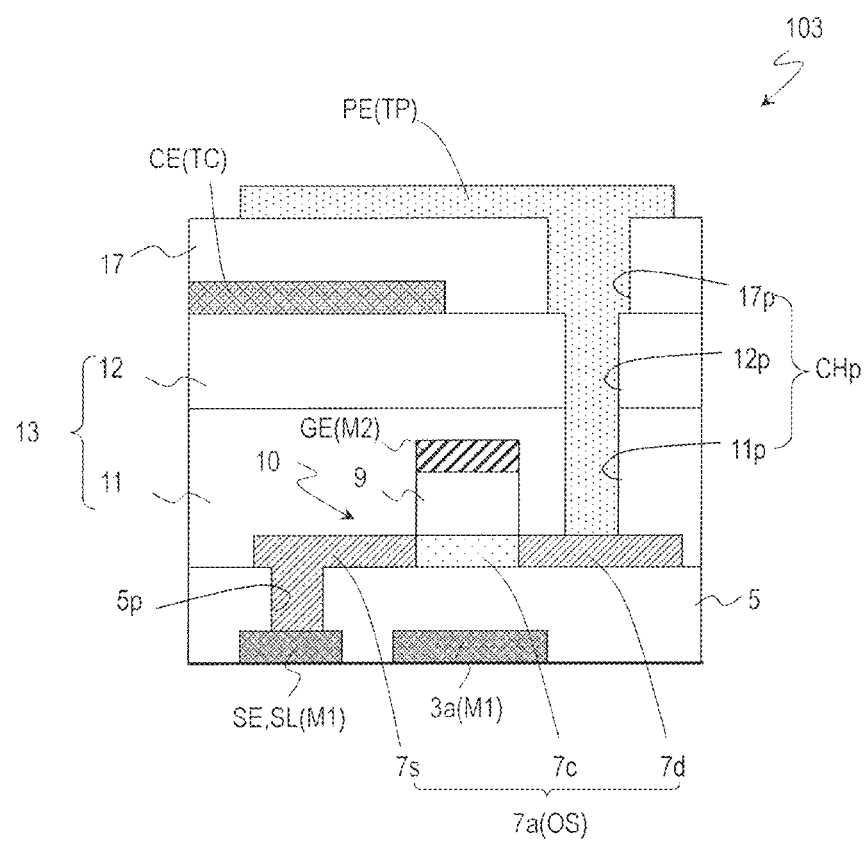
FIG. 19A is a cross-sectional view illustrating a pixel area in an active matrix substrate 103 according to Modified Example 3.
Figure 19B:
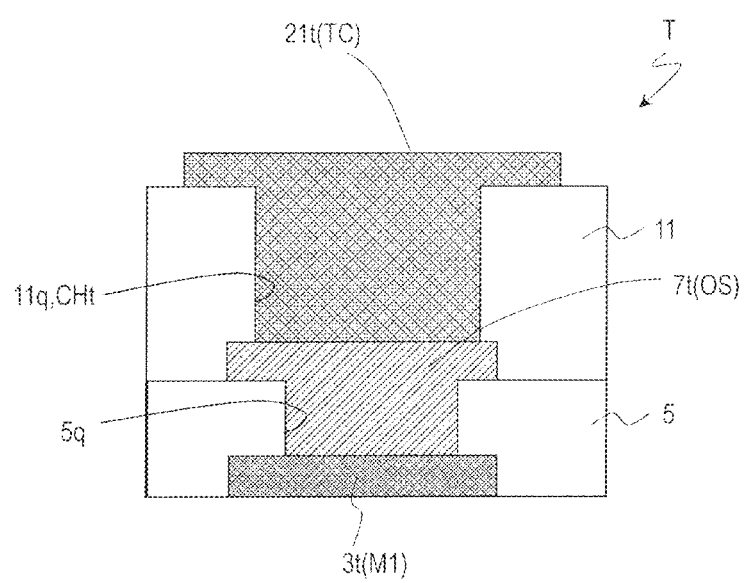
FIG. 19B is a cross-sectional view illustrating a wiring line connection section (terminal section T) in the active matrix substrate 103 according to Modified Example 3.

FIGS. 19A and 19B are cross-sectional views illustrating a pixel area P and a terminal section T, respectively, in an active matrix substrate 103 according to Modified Example 3. As illustrated in the figure, the first upper conductive portion 21t may be formed in the common electrode layer TC (specifically, using the same conductive film as that in the common electrode CE) in Modified Example 3.

Modified Example 4

Figure 20A:
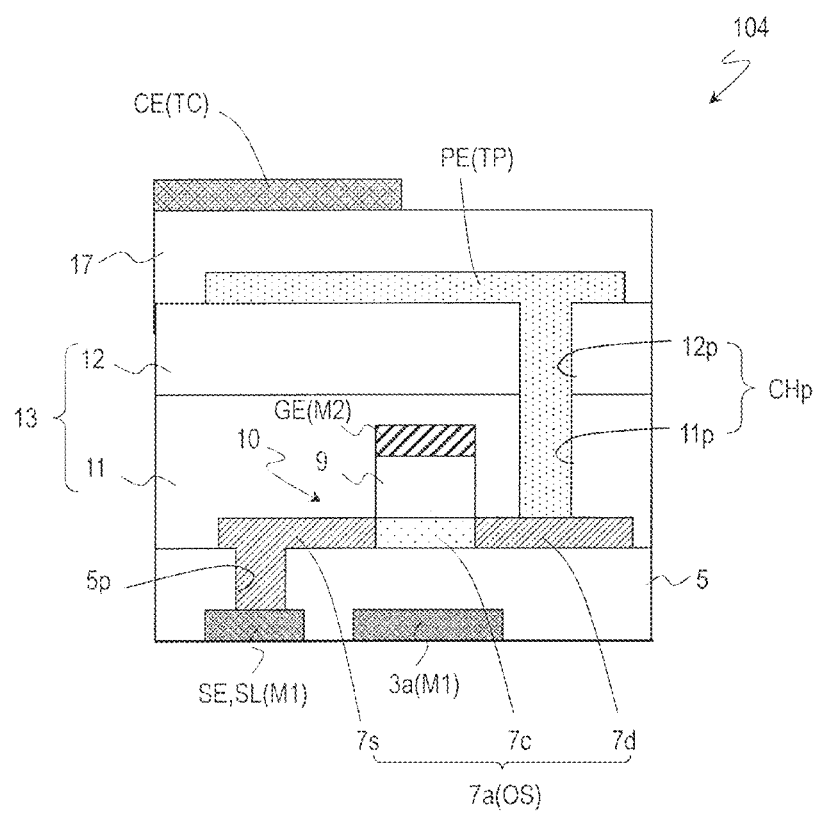
FIG. 20A is a cross-sectional view illustrating a pixel area in an active matrix substrate 104 according to Modified Example 4.
Figure 20B:
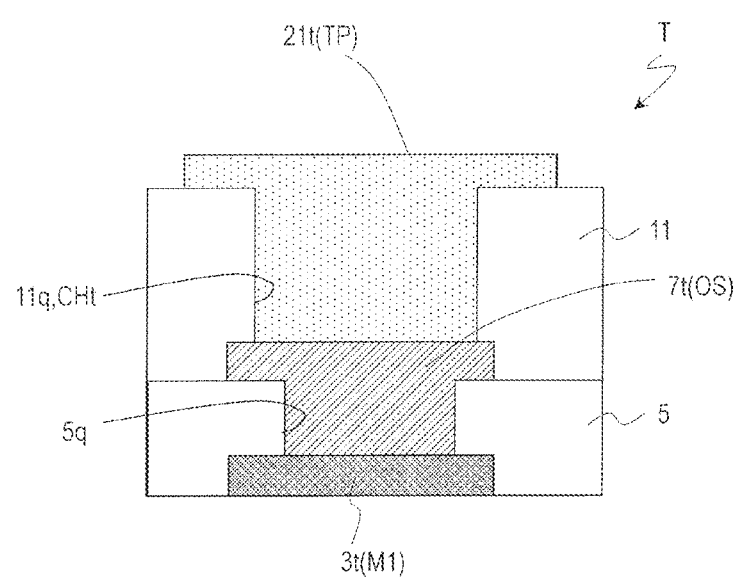
FIG. 20B is a cross-sectional view illustrating a wiring line connection section (terminal section T) in the active matrix substrate 104 according to Modified Example 4.

FIGS. 20A and 20B are cross-sectional views illustrating a pixel area P and a terminal section T, respectively, in an active matrix substrate 104 according to Modified Example 4.

The active matrix substrate 104 according to Modified Example 4 differs from the active matrix substrate 100 described above in that the common electrode CE is disposed over the pixel electrode PE with the dielectric layer 17 interposed therebetween.

The pixel electrode layer TP includes the pixel electrode PE and the first upper conductive portion 21t. The pixel electrode PE is disposed on the upper insulating layer 13 and is connected to the second region 7d within the pixel contact holes CHp formed in the upper insulating layer 13. The pixel electrode layer TP is covered with the dielectric layer 17 and the common electrode CE is disposed on the dielectric layer 17. Although not illustrated, a slit or notched portion is formed in the common electrode CE serving as the upper electrode.

In the terminal section T, as illustrated in FIG. 19B, the first upper conductive portion 21t is formed on the protective insulating layer 11 and within the opening 11t (terminal section contact hole CHt) formed in the protective insulating layer 11. Although not illustrated, the first upper conductive portion 21t may be formed using the same conductive film as the common electrode CE serving as the upper electrode in the terminal section T.

Note that, although not illustrated, in the active matrix substrates according to Modified Example 2 to Modified Example 4 also, an oxide semiconductor TFT having a double gate structure may be formed and the gate contact section GC described above with reference to FIGS. 15A and 15C may be provided.

Oxide Semiconductor

The oxide semiconductor contained in the oxide semiconductor layer 7a may be an amorphous oxide semiconductor, or may be a crystalline oxide semiconductor including a crystalline portion. Examples of the crystalline oxide semiconductor include a polycrystalline oxide semiconductor, a microcrystalline oxide semiconductor, or a crystalline oxide semiconductor having a c-axis oriented substantially perpendicular to the layer surface.

The oxide semiconductor layer 7a may have a layered structure including two or more layers. In a case where the oxide semiconductor layer 7a includes a layered structure, the oxide semiconductor layer 7a may include an amorphous oxide semiconductor layer and a crystalline oxide semiconductor layer. Alternatively, the oxide semiconductor layer may include a plurality of crystalline oxide semiconductor layers having different crystal structures. In addition, the oxide semiconductor layer may include a plurality of amorphous oxide semiconductor layers. In a case where the oxide semiconductor layer 7a has a dual-layer structure including an upper layer and a lower layer, an energy gap of the oxide semiconductor included in a layer closer to the gate electrode (that is the lower layer in the case of the bottom gate structure, and the upper layer in the case of the top gate structure) may be smaller than an energy gap of the oxide semiconductor included in a layer farther from the gate electrode (that is the upper layer in the case of the bottom gate structure, and the lower layer in the case of the top gate structure). However, in a case where a difference in the energy gap between these layers is relatively small, the energy gap of the oxide semiconductor included in the layer closer to the gate electrode may be greater than the energy gap of the oxide semiconductor included in the layer farther from the gate electrode.

Materials, structures, and film formation methods of an amorphous oxide semiconductor and the above-described crystalline oxide semiconductors, a configuration of an oxide semiconductor layer including a layered structure, and the like are described in, for example, JP 2014-007399 A. The entire contents of the disclosure of JP 2014-007399 A are incorporated herein as reference.

The oxide semiconductor layer 7a may include, for example, at least one metal element selected from In, Ga, and Zn. In the present embodiment, the oxide semiconductor layer 7a includes, for example, an In—Ga—Zn—O based semiconductor (for example, an indium gallium zinc oxide). Here, the In—Ga—Zn—O based semiconductor is a ternary oxide of In (indium), Ga (gallium), and Zn (zinc), and a ratio (composition ratio) of In, Ga, and Zn is not particularly limited. For example, the ratio includes In:Ga:Zn=2:2:1, In:Ga:Zn=1:1:1, or In:Ga:Zn=1:1:2. Such an oxide semiconductor layer 7a can be formed of an oxide semiconductor film including an In—Ga—Zn—O based semiconductor.

The In—Ga—Zn—O based semiconductor may be an amorphous semiconductor, or may be a crystalline semiconductor. A crystalline In—Ga—Zn—O based semiconductor in which a c-axis is oriented substantially perpendicular to a layer surface is preferable as the crystalline In—Ga—Zn—O based semiconductor.

Note that a crystal structure of the crystalline In—Ga—Zn—O based semiconductor is disclosed in, for example, JP 2014-007399 A, JP 2012-134475 A, and JP 2014-209727 A as described above. The entire contents of the disclosure of JP 2012-134475 A and JP 2014-209727 A are incorporated herein as reference. A TFT including an In—Ga—Zn—O based semiconductor layer has high mobility (more than 20 times as compared to an a-Si TFT) and a low leakage current (less than 1/100th as compared to the a-Si TFT), and thus such a TFT can be used suitably as a driving TFT (for example, a TFT included in a drive circuit provided in a periphery of a display region including a plurality of pixels, and on the same substrate as the display region) and a pixel TFT (TFT provided in a pixel).

In place of the In—Ga—Zn—O based semiconductor, the oxide semiconductor layer 7a may include another oxide semiconductor. For example, the oxide semiconductor layer may include an In—Sn—Zn—O based semiconductor (for example, $In_2O_3$—$SnO_2$—ZnO; InSnZnO). The In—Sn—Zn—O based semiconductor is a ternary oxide of In (indium), Sn (tin), and Zn (zinc). Alternatively, the oxide semiconductor layer 7a may include an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, an Al—Ga—Zn—O based semiconductor, a Ga—Zn—O based semiconductor, an In—Ga—Zn—Sn—O based semiconductor, and the like.

INDUSTRIAL APPLICABILITY

The embodiments of the disclosure can be widely applied to various semiconductor devices provided with an oxide semiconductor TFT. The embodiments are also applied to various electronic devices, including circuit substrates such as an active matrix substrate, display devices such as a liquid crystal display device, an organic electroluminescence (EL) display device, an inorganic electroluminescence display device, and an MEMS display device, image taking devices such as an image sensor device, image input devices, fingerprint readers, semiconductor memories, and the like, for example. In particular, the disclosure is preferably applied to a high definition liquid crystal display device.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:
1. An active matrix substrate comprising:
  a display area including a plurality of pixel areas and a non-display region other than the display area;
  a substrate;
  a first conductive layer being provided on the substrate, a portion of the first conductive layer working as a plurality of source lines;
  a first insulating layer being provided on the first conductive layer, the first insulating layer including a first opening;
  a metal oxide layer being provided on the first insulating layer, a portion of the metal oxide layer working as an oxide semiconductor layer of an oxide semiconductor TFT disposed in each of the plurality of pixel areas;
  a second conductive layer being provided over the metal oxide layer, a portion of the second conductive layer working as a gate electrode of the oxide semiconductor TFT;
  a second insulating layer being provided on the second conductive layer, the second insulating layer including a second opening; and
  a third conductive layer being provided on the second insulating layer, a portion of the third conductive layer working as an electrode electrically connected to the oxide semiconductor TFT; wherein
  the second opening is located over the first opening;
  a first electrical conducting path between the first conductive layer and the metal oxide layer is in the first opening;
  a second electrical conducting path between the second conductive layer and the third conductive layer is in the second opening; and
  an electrically connection of the first conductive layer, the second conductive layer, the third conductive layer and the metal oxide layer is achieved by the first opening and the second opening.

2. The active matrix substrate according to claim 1, further comprising:
  a third insulating layer being provided between the metal oxide layer and the second conductive layer, a portion of the third insulating layer working as a gate insulating layer arranged between the oxide semiconductor layer of the oxide semiconductor TFT and the gate electrode; wherein
  the oxide semiconductor layer includes a channel region, a first region, and a second region;
  the first region and the second region are located at two sides of the channel region; and
  specific resistances of the first region and the second region are lower than that of the channel region.

3. The active matrix substrate according to claim 2, wherein
  the first opening overlaps with a portion of the first conductive layer;
  the metal oxide layer is provided on the first insulating layer and in the first opening and electrically connected to the first conductive layer within the first opening;
  in the first opening, the third insulating layer is provided only on a first portion of the metal oxide layer and is not provided on a second portion of the metal oxide layer other than the first portion;
  the second conductive layer is provided over the first portion of the metal oxide layer via the third insulating layer;
  in the second opening, the third conductive layer is provided on a portion of the second conductive layer and a portion of the second portion of the metal oxide layer; and
  specific resistance of the second portion of the metal oxide layer is lower than that of the first portion of the metal oxide layer.

4. The active matrix substrate according to claim 2, wherein
  the second insulating layer includes a lower insulating layer in contact with the second conductive layer and an upper insulating layer in contact with the third conductive layer; and
  the lower insulating layer is a reductive insulating layer capable of reducing the oxide semiconductor layer and in direct contact with the first region and the second region of the oxide semiconductor layer and not in direct contact with the channel region of the oxide semiconductor layer.

5. The active matrix substrate according to claim 3, wherein
  the second insulating layer includes a lower insulating layer in contact with the second conductive layer and an upper insulating layer in contact with the third conductive layer; and
  the lower insulating layer is a reductive insulating layer capable of reducing the metal oxide layer and in direct contact with the second portion of the metal oxide layer and not in direct contact with the first portion of the metal oxide layer.

6. The active matrix substrate according to claim 1, wherein
  a plurality of the electrically connection are located in the non-display region.

7. The active matrix substrate according to claim 1, wherein
   the oxide semiconductor layer includes an In-Ga-Zn-O based semiconductor.

8. The active matrix substrate according to claim 1, wherein
   the first conductive layer includes one of a metal layer of Cu, Al and Mo.

9. The active matrix substrate according to claim 1, wherein
   the first conductive layer includes a conductive oxide layer; and
   the metal oxide layer is in direct contact with the conductive oxide layer within the first opening.

10. The active matrix substrate according to claim 9, wherein the conductive oxide layer is an In-Zn-O based layer or an In-Ga-Zn-O based layer.

* * * * *